United States Patent
Hakim et al.

(10) Patent No.: US 12,213,295 B2
(45) Date of Patent: Jan. 28, 2025

(54) DIAMOND-BASED ELECTROMAGNETIC INTERFERENCE SHIELD

(71) Applicant: EllansaLabs Inc., Addison, TX (US)

(72) Inventors: Omar Besim Hakim, Addison, TX (US); David S. Wesson, Fort Worth, TX (US)

(73) Assignee: Ellansalabs Inc., Dallas, TX (US)

( * ) Notice: Subject to any disclaimer, the term of this patent is extended or adjusted under 35 U.S.C. 154(b) by 0 days.

(21) Appl. No.: 18/412,903

(22) Filed: Jan. 15, 2024

(65) Prior Publication Data

US 2024/0155820 A1    May 9, 2024

Related U.S. Application Data

(63) Continuation-in-part of application No. 18/184,463, filed on Mar. 15, 2023.

(51) Int. Cl.
| | |
|---|---|
| *H05K 9/00* | (2006.01) |
| *B23K 26/00* | (2014.01) |
| *B23K 26/352* | (2014.01) |
| *B23K 101/36* | (2006.01) |
| *B23K 103/00* | (2006.01) |
| *B23K 103/08* | (2006.01) |

(52) U.S. Cl.
CPC ....... *H05K 9/0088* (2013.01); *B23K 26/0006* (2013.01); *B23K 26/352* (2015.10); *B23K 2101/36* (2018.08); *B23K 2103/08* (2018.08); *B23K 2103/50* (2018.08)

(58) Field of Classification Search
CPC .................................................. H05K 9/0088
See application file for complete search history.

(56) References Cited

U.S. PATENT DOCUMENTS

| | | | |
|---|---|---|---|
| 5,714,102 A * | 2/1998 | Highum | B32B 27/18 |
| | | | 264/105 |
| 5,753,887 A | 5/1998 | Rosenwasser et al. | |
| 5,760,367 A | 6/1998 | Rosenwasser | |
| 7,204,428 B2 | 4/2007 | Wilson | |
| 7,284,396 B2 | 10/2007 | Barron et al. | |
| 7,537,877 B2 | 5/2009 | Yoshiba et al. | |
| 7,773,749 B1 | 8/2010 | Durst et al. | |
| 8,851,372 B2 | 10/2014 | Zhou et al. | |
| 9,239,414 B2 | 1/2016 | Rey et al. | |

(Continued)

FOREIGN PATENT DOCUMENTS

| | | |
|---|---|---|
| AU | 2006246300 A1 | 11/2006 |
| BR | PI0906398-6 A2 | 8/2011 |

(Continued)

OTHER PUBLICATIONS

Bharadwaj et al., "Femtosecond laser written photonic and microfluidic circuits in diamond," J. Phys.:Photonics 1, 2019.

(Continued)

*Primary Examiner* — Hung V Ngo
(74) *Attorney, Agent, or Firm* — Dickinson Wright PLLC

(57) ABSTRACT

Disclosed herein are apparatuses and methods for providing a shield tile. In some embodiments, the shield tile includes a diamond in a shape of a prism. The diamond includes a first region converted to graphite. The first region is parallel to a base of the prism, and the first region extends to at least one face of the prism.

11 Claims, 19 Drawing Sheets

(56) References Cited

U.S. PATENT DOCUMENTS

| | | |
|---|---|---|
| 9,269,576 B2 | 2/2016 | Yamauchi et al. |
| 10,281,398 B2 | 5/2019 | Zheng et al. |
| 10,471,478 B2 | 11/2019 | Gil |
| 10,603,685 B2 | 3/2020 | Zheng et al. |
| 10,620,121 B2 | 4/2020 | Zheng et al. |
| 11,074,650 B1 | 7/2021 | Madisetti |
| 11,484,011 B2 | 11/2022 | Chapman |
| 11,488,122 B2 | 11/2022 | Diamond et al. |
| 11,514,689 B2 | 11/2022 | Niskanen |
| 11,599,650 B2 | 3/2023 | Ely et al. |
| 11,783,145 B2 | 10/2023 | Hakim |
| 2003/0088295 A1 | 5/2003 | Cox |
| 2003/0120613 A1 | 6/2003 | Neogi |
| 2003/0198800 A1* | 10/2003 | Hoffman ............... H05K 9/0003 428/323 |
| 2003/0223054 A1 | 12/2003 | Warwick |
| 2004/0112087 A1 | 6/2004 | Bishop |
| 2005/0121417 A1 | 6/2005 | Dixon |
| 2006/0196858 A1 | 9/2006 | Barron et al. |
| 2007/0058775 A1 | 3/2007 | Benderly |
| 2007/0092647 A1 | 4/2007 | Scarsbrook et al. |
| 2008/0115212 A1 | 5/2008 | Arias et al. |
| 2010/0018955 A1 | 1/2010 | Martinez |
| 2010/0310839 A1 | 12/2010 | Rey et al. |
| 2012/0120465 A1 | 5/2012 | Martinez et al. |
| 2012/0167210 A1 | 6/2012 | Oro Garcia et al. |
| 2013/0160639 A1* | 6/2013 | Lee ........................ F41H 5/013 264/603 |
| 2014/0139608 A1 | 5/2014 | Rosario et al. |
| 2015/0084193 A1 | 3/2015 | Feng et al. |
| 2015/0213734 A1 | 7/2015 | Glickman |
| 2016/0099852 A1 | 4/2016 | Cook et al. |
| 2016/0167164 A9 | 6/2016 | Rosario et al. |
| 2016/0232432 A1 | 8/2016 | Regev |
| 2016/0275585 A1 | 9/2016 | Scoggins |
| 2016/0300234 A1 | 10/2016 | Moss-Pultz et al. |
| 2016/0374775 A1 | 12/2016 | Prpa et al. |
| 2017/0009376 A1 | 1/2017 | Khan et al. |
| 2017/0196318 A1 | 7/2017 | Wagner |
| 2017/0261855 A1 | 9/2017 | Moore et al. |
| 2018/0109494 A1 | 4/2018 | Yu et al. |
| 2018/0293474 A1 | 10/2018 | Almog |
| 2018/0365450 A1 | 12/2018 | Cheng |
| 2019/0114698 A1 | 4/2019 | Lutnick et al. |
| 2019/0130100 A1 | 5/2019 | Dymshits et al. |
| 2019/0169876 A1 | 6/2019 | Hennessy et al. |
| 2019/0355037 A1 | 11/2019 | Desai |
| 2019/0366475 A1 | 12/2019 | Scarselli et al. |
| 2019/0378145 A1 | 12/2019 | Mayer |
| 2020/0076786 A1 | 3/2020 | Spivack et al. |
| 2020/0145454 A1 | 5/2020 | Galliano et al. |
| 2020/0246681 A1 | 8/2020 | Chen |
| 2021/0027447 A1 | 1/2021 | Parikh et al. |
| 2021/0158118 A1 | 5/2021 | Benderly |
| 2021/0160235 A1 | 5/2021 | Lerner |
| 2021/0287288 A1 | 9/2021 | Madisetti et al. |
| 2021/0319722 A1 | 10/2021 | Ionin et al. |
| 2021/0356402 A1 | 11/2021 | Kerner et al. |
| 2021/0358004 A1 | 11/2021 | Chang et al. |
| 2021/0390531 A1 | 12/2021 | Voorhees et al. |
| 2022/0254174 A1 | 8/2022 | Hong |
| 2022/0376896 A1 | 11/2022 | Hakim |
| 2022/0394892 A1* | 12/2022 | Han ..................... H05K 9/0092 |
| 2023/0016065 A1 | 1/2023 | Diamond |
| 2023/0128931 A1 | 4/2023 | Hakim |
| 2023/0168206 A1 | 6/2023 | Hakim |
| 2023/0177294 A1 | 6/2023 | Hakim |
| 2023/0200502 A1 | 6/2023 | Hakim |
| 2023/0210231 A1 | 7/2023 | Hakim |
| 2023/0357024 A1 | 11/2023 | Hakim |
| 2024/0104326 A1 | 3/2024 | Hakim |
| 2024/0201096 A1 | 6/2024 | Hakim |

FOREIGN PATENT DOCUMENTS

| | | |
|---|---|---|
| CN | 105539248 A | 5/2016 |
| CN | 107110788 A | 8/2017 |
| CN | 107480745 A | 12/2017 |
| CN | 109034324 A | 12/2018 |
| CN | 109903135 A | 6/2019 |
| CN | 210579489 U | 5/2020 |
| CN | 112908147 A | 6/2021 |
| DE | 202017105345 U1 | 9/2017 |
| DE | 102019217511 A1 | 5/2021 |
| DE | 102020120669 A1 | 2/2022 |
| EP | 1321305 A2 | 6/2003 |
| EP | 3305461 A1 | 4/2018 |
| EP | 3324176 A1 | 5/2018 |
| EP | 3671674 A1 | 6/2020 |
| EP | 3886031 A1 | 9/2021 |
| EP | 2172933 A1 | 12/2022 |
| EP | 4102399 A1 | 12/2022 |
| FR | 3021325 A1 | 11/2015 |
| FR | 3084848 A1 | 2/2020 |
| IN | 29/2016 | 7/2016 |
| JP | 2004086828 A | 3/2004 |
| JP | 2016022308 A | 2/2016 |
| KR | 100344886 B1 | 7/2002 |
| KR | 20050027336 A | 3/2005 |
| KR | 20090123356 A | 12/2009 |
| KR | 20130001757 A | 1/2013 |
| KR | 20130140404 A | 12/2013 |
| KR | 101476264 B1 | 12/2014 |
| KR | 101734534 B1 | 5/2017 |
| KR | 20170116509 A | 10/2017 |
| KR | 20190049187 A | 5/2019 |
| KR | 20190108435 A | 9/2019 |
| KR | 20190108441 A | 9/2019 |
| KR | 102052735 B1 | 12/2019 |
| KR | 102052736 B1 | 12/2019 |
| KR | 102060972 B1 | 12/2019 |
| KR | 20190139170 A | 12/2019 |
| KR | 20200015650 A | 2/2020 |
| KR | 20200054122 A | 5/2020 |
| KR | 20200055813 A | 5/2020 |
| KR | 20200060311 A | 5/2020 |
| KR | 20200065307 A | 6/2020 |
| KR | 20200071802 A | 6/2020 |
| KR | 20200095282 A | 8/2020 |
| KR | 102152449 B1 | 9/2020 |
| KR | 20200106140 A | 9/2020 |
| KR | 20200113602 A | 10/2020 |
| KR | 20200131196 A | 11/2020 |
| KR | 102207713 B1 | 1/2021 |
| KR | 20210005837 A | 1/2021 |
| KR | 20210005838 A | 1/2021 |
| KR | 20210015495 A | 2/2021 |
| KR | 102286977 B1 | 8/2021 |
| KR | 20210098900 A | 8/2021 |
| KR | 20220157369 A | 11/2022 |
| KR | 102473589 B1 | 12/2022 |
| RU | 2719611 C1 | 4/2020 |
| RU | 2750068 C1 | 6/2021 |
| TW | 200536733 A | 11/2005 |
| TW | M508306 U | 9/2015 |
| TW | M534739 U | 1/2017 |
| TW | 201743243 A | 12/2017 |
| TW | 202236418 A | 9/2022 |
| WO | 2005027677 A2 | 3/2005 |
| WO | 2006119561 A1 | 11/2006 |
| WO | 2009092794 A2 | 7/2009 |
| WO | 2010081986 A1 | 7/2010 |
| WO | 2012048510 A1 | 4/2012 |
| WO | 2015125134 A1 | 8/2015 |
| WO | 2016124176 A1 | 8/2016 |
| WO | 2017145004 A1 | 8/2017 |
| WO | 2017208053 A1 | 12/2017 |
| WO | 2018045726 A1 | 3/2018 |
| WO | 2019088358 A1 | 5/2019 |
| WO | 2019177184 A1 | 9/2019 |
| WO | 2020096097 A1 | 5/2020 |
| WO | 2020101097 A1 | 5/2020 |

(56) References Cited

FOREIGN PATENT DOCUMENTS

| | | | |
|---|---|---|---|
| WO | 2020105752 | A1 | 5/2020 |
| WO | 2020130932 | A1 | 6/2020 |
| WO | 2020161462 | A1 | 8/2020 |
| WO | 2021075651 | A2 | 4/2021 |
| WO | 2021095795 | A1 | 5/2021 |
| WO | 2021155054 | A1 | 8/2021 |
| WO | 2021209952 | A1 | 10/2021 |
| WO | 2022040304 | A1 | 2/2022 |
| WO | 2022127759 | A1 | 6/2022 |
| WO | 2022224044 | A1 | 10/2022 |
| WO | 2022243840 | A1 | 11/2022 |
| WO | 2023102576 | A2 | 6/2023 |
| WO | 2024051981 | A1 | 3/2024 |

OTHER PUBLICATIONS

Sotillo et al., "Diamond photonics platform enabled by femtosecond laser writing," www.nature.com/scientificreports, published Oct. 17, 2016.

Coccia et al., "Femtosecond laser writing of integrated photonic circuits in diamond," EPJ Web of Conferences 255, 12006, 2021, https://doi.org/10.1051/epjconf/202125512006.

Sun et al., "High conductivity micro-wires in diamond following arbitrary paths," Applied Physics Letters 105, 231105, 2014, http://dx.doi.org/10.1063/1.4902998.

Bloomer et al., "A single-crystal diamond X-ray pixel detector with embedded graphitic electrodes," Journal of Synchrotron Radiation, vol. 27, Part 3, May 2020, pp. 599-607.

Salter, "Laser Engineering Nanocarbon Phases within Diamond for Science and Electronics," ACS Publications, ACS Nano 2024, 18, pp. 2861-2871, https://doi.org/10.1021/acsnano.3c07116.

Janssens et al., "Direct Laser Writing of Nanochannels Between Ultra-Thin Nanocrystalline Diamond Films and Glass Substrates," Okinawa Institute of Science and Technology, Graduate University, 2023 MRS Fall Meeting, presented Nov. 28, 2023.

Salter et al., Abstract, "Femtosecond Laser Writing Inside Diamond," University of Oxford, 2023 MRS Fall Meeting, presented Nov. 28, 2023.

Mendonca et al., "Direct Laser Writing for Diamond NV Centers Placement," University of Sao Paulo, 2023 MRS Fall Meeting, presented Nov. 28, 2023.

International Search Report and Written Opinion for PCT Application No. PCT/US2022/048070, dated Mar. 6, 2023, 10 pages.

International Search Report and Written Opinion for PCT Application No. PCT/US2022/036842, dated Jan. 16, 2023, 12 pages.

International Search Report and Written Opinion for PCT Application No. PCT/US2022/025591, dated Jan. 18, 2023, 20 pages.

Tharaka Hewa et al., "Survey on Blockchain based Smart Contracts: Applications, Opportunities and Challenges" Journal of Network and Computer Applications, Sep. 21, 2020, 56 pages.

International Search Report and Written Opinion for PCT Application No. PCT/US2024/031386 dated Jul. 23, 2024, 14 pages.

International Search Report and Written Opinion for PCT Application No. PCT/US2023/016914, dated Jun. 27, 2023, 16 pages.

International Search Report and Written Opinion for PCT Application No. PCT/US2023/016942, dated Jun. 27, 2023, 16 pages.

International Search Report and Written Opinion for PCT Application No. PCT/US2023/016945, dated Jul. 20, 2023, 15 pages.

International Search Report and Written Opinion for PCT Application No. PCT/US2023/016918, dated Jul. 20, 2023, 14 pages.

International Search Report and Written Opinion for PCT Application No. PCT/US2023/016916, dated Jul. 20, 2023, 16 pages.

Cartier, et al., "Laser Inscription and Marking of Gemstones An Overview of Options", InColorMagazine.com; Gemstone.org, International Colored Gemstone Association, Summer 2019, pp. 66-69.

OPSYDIA.com; Securing the Identity of Diamonds, Mar. 2022 (downloaded Mar. 1, 2023).

Search Report regarding PCT/US2024/031381; mailed Sep. 23, 2024.

International Preliminary Report on Patentability regarding PCT/US2023/016914; mailed Oct. 31, 2024.

International Preliminary Report on Patentability regarding PCT/US2022/025591; mailed Oct. 31, 2024.

International Preliminary Report on Patentability regarding PCT/US2023/016916; mailed Oct. 31, 2024.

\* cited by examiner

DIAMOND-BASED ELECTROMAGNETIC INTERFERENCE SHIELD

CROSS-REFERENCE TO RELATED APPLICATIONS

This application is a continuation-in-part of U.S. application patent Ser. No. 18/184,463, filed Mar. 15, 2023 titled "Diamonds Having Artificially Embedded Inclusions," the entire disclosure of which is hereby incorporated by reference.

TECHNICAL FIELD

The present specification generally relates to synthetic or cultured diamonds and, more particularly, to diamonds having an artificially embedded inclusion incorporated internally within the crystal structure of the diamond, during the synthesis thereof.

BACKGROUND

Authenticating markings on diamonds are commonly engraved thereon via an inscription which can be placed on an outer layer of the diamond, such as the girdle portion. This is a small external area of the diamond which can be easily manipulated so that the markings, indicia, or authenticating identifiers inscribed thereon can be removed. Embedding images or authenticating indicia internally within gemstones is also known. Commonly this requires that a diamond be cut into two portions, with the markings being laser ablated onto the surface of one portion of the cut diamond, and thereafter joining of the two pieces through a bonding agent or through a bonding process. These methods are not desirable as the bonding agent can affect the clarity and luminosity of the diamond, and can also potentially degrade over time.

Additionally, incorporation of small decorative gemstones within a larger gemstone, currently involves techniques wherein the smaller gemstone is placed within a cavity of an external surface of the larger gemstone. While this provides a pleasing decorative effect, the anchoring and securing of the smaller stone to the larger gemstone can be problematic, and unreliable over time as the smaller stone may become loose or otherwise detach from the larger gemstone.

In light of these drawbacks there is a need for diamonds which have incorporated therein smaller decorative gemstones, or inclusions such as authenticating markings, inscriptions or other identifying or decorative indicia, which cannot easily be removed and which are incorporated within the diamond in a secure and everlasting manner.

SUMMARY

Described herein are synthetic, or cultured diamonds which have at least one artificially embedded inclusion(s) incorporated within their crystal structure during the diamond's synthesis, deposition or growth process.

In one embodiment, a cultured diamond is disclosed. The cultured diamond has
  a substrate portion;
  at least one artificially embedded inclusion(s) disposed on the substrate portion; and
  an encapsulating portion, formed on the at least one artificially embedded inclusion(s).

The substrate portion and the encapsulating portion are bonded together by covalent carbon to carbon bonds. Both the substrate portion and the encapsulating portion are comprised of a diamond and have an un-interrupted, continuous crystal lattice structure which is created during the deposition process of the encapsulating portion onto the substrate portion.

The substrate portion and/or the encapsulating portion are formed by known diamond deposition or synthesis processes. Such processes known in the art include chemical vapor deposition (CVD) methods, such as hot filament chemical vapor deposition (HFCVD) and microwave plasma chemical vapor deposition (MPCVD), or high pressure high temperature (HPHT) process.

In an embodiment, the at least one artificially embedded inclusion comprises human-readable or machine-readable indicia. The indicia, in one embodiment, is an authentication identifier, a QR code, a bar code, an alphanumeric marking, written text, a personalized inscription, an image, a decorative design, a symbol, a pattern, a logo, or a combination of any of the foregoing human-readable or machine readable indicia.

In another embodiment, the artificially embedded inclusion, comprises a secondary gemstone.

In additional embodiments, a cultured diamond is disclosed, the diamond having:
  a substrate portion comprising a diamond;
  at least one inclusion(s) comprising one or more non-diamond carbon layer (s); and
  an encapsulating portion comprising a diamond, formed onto the at least one inclusion(s) and the substrate portion.

The substrate portion and the encapsulating portion are bonded through covalent carbon to carbon bonds. In further embodiments, the at least one inclusion(s) are also bonded to the encapsulating portion through covalent carbon to carbon bonds. In these embodiments, the one or more non-diamond carbon layer(s) refer to deposited graphite layers, deposited graphene layers, deposited amorphous carbon, or graphitized layers.

In another embodiment, a method of embedding an artificial inclusion(s) in a diamond, is disclosed, the method comprising the steps of:
  forming a substrate portion comprising a diamond;
  disposing at least one artificial inclusion(s) on the substrate portion; and
  forming an encapsulating portion comprising a diamond, onto the artificial inclusion and substrate portion.

In one embodiment, the substrate portion and the encapsulating portion are formed by chemical vapor deposition (CVD), hot filament chemical vapor deposition (HFCVD), plasma enhanced chemical vapor deposition (PECVD), microwave plasma chemical vapor deposition, or a high temperature high pressure (HPHT) process. Due to the various steps of the deposition methods described herein, the final formed cultured diamond will have a uninterrupted diamond crystal lattice between the substrate portion and the encapsulating portion, wherein carbon to carbon covalent bonds will be present and hence, these will no longer be considered as separate portions of the diamond but will exist as one unified diamond structure.

In one embodiment the disclosed method, the at least one artificial inclusion(s) comprises a secondary gemstone. The secondary gemstone comprises a gray diamond, white diamond, blue diamond, yellow diamond, orange diamond, red diamond, olive diamond, green diamond, pink diamond, violet diamond, brown diamond, black diamond, garnet, ruby, peridot, sapphire, diopside, emerald, amethyst, topaz, citrine, or a combination thereof.

Selected Definitions

As used herein, "cultured diamond", "synthetic diamond", "lab-grown diamond" or variations thereof refer to a non-naturally formed diamond, which has been grown or synthesized with methods, materials and/or equipment capable of artificially growing diamonds.

As used herein, the term "inclusion", or "artificial inclusion" or "artificially embedded inclusion", or variations thereof, refer to a non-naturally occurring structure which has been created within, or placed or disposed within, an internal portion of a diamond, according to embodiments disclosed herein. As used in this disclosure, the term "inclusion" is not to be understood as referring to naturally occurring inclusions in diamond crystal structures, either through natural synthesis of a diamond or through synthetic synthesis of a diamond.

As used herein the term "chemical vapor deposition" or "CVD" or variations thereof refer to a deposition process wherein reactant gases are introduced into a chamber of a reactor or vessel and through various activation media are activated to react and deposit specific species onto a substrate as a solid form deposited material. The use of the term "chemical vapor deposition" is to be understood as comprising all types of chemical vapor deposition processes, including hot filament CVD, plasma enhanced CVD, RF plasma CVD, DC plasma CVD, microwave plasma CVD, and any other known variations of chemical vapor deposition processes.

As used herein, "weight percent," "wt %, "percent by weight," "% by weight," and variations thereof refer to the concentration of a substance as the weight of that substance divided by the total weight of the composition and multiplied by 100.

As used herein, "volumetric percent," "vol %", "percent by volume,", "volume percent", and variations thereof refer to the relative content of a substance as the mole of that substance divided by the total volume of the composition and multiplied by 100.

As used herein, "g" represents gram; "L" represents liter; "mg" represents "milligram ($10^{-3}$ gram);" "μg" equals to one micron gram ($10^{-6}$ gram). "mL" or "cc" represents milliliter ($10^{-3}$ liter). One "μL" equals to one micron liter ($10^{-6}$ liter). The units "mg/100 g," "mg/100 mL," or "mg/L" are units of concentration or content of a component in a composition. One "mg/L" equals to one ppm (part per million). "Da" refers to Dalton, which is the unit for molecular weight; One Da equals to one g/mol. The unit of temperature used herein is degree Celsius (° C.).

The term "about" is used in conjunction with numeric values to include normal variations in measurements as expected by persons skilled in the art, and is understood to have the same meaning as "approximately" and to cover a typical margin of error, such as ±15%, ±10%, ±5%, ±1%, ±0.5%, or even ±0.1% of the stated value. The term "about" also encompasses amounts that differ due to different equilibrium conditions for a composition resulting from a particular initial composition. Whether or not modified by the term "about," the claims include equivalents to the quantities.

It should be noted that, as used in this specification and the appended claims, the singular forms "a," "an," and "the" include plural referents unless the content clearly dictates otherwise. Thus, for example, reference to a composition containing "a compound" includes having two or more compounds that are either the same or different from each other. It should also be noted that the term "or" is generally employed in its sense including "and/or" unless the content clearly dictates otherwise. As used herein, "and/or" refers to and encompasses any and all possible combinations of one or more of the associated listed items, as well as the lack of combinations when interpreted in the alternative ("or").

In the interest of brevity and conciseness, any ranges of values set forth in this specification contemplate all values within the range and are to be construed as support for claims reciting any sub-ranges having endpoints which are real number values within the specified range in question. By way of a hypothetical illustrative example, a disclosure in this specification of a range of from 1 to 5 shall be considered to support claims to any of the following ranges: 1-5; 1-4; 1-3; 1-2; 2-5; 2-4; 2-3; 3-5; 3-4; and 4-5.

The term "substantially" is utilized herein to represent the inherent degree of uncertainty that can be attributed to any quantitative comparison, value, measurement, or other representation. The term "substantially" is also utilized herein to represent the degree by which a quantitative representation can vary from a stated reference without resulting in a change in the basic function of the subject matter at issue.

The term "substantially free" may refer to any component that the composition of the disclosure lacks or mostly lacks. When referring to "substantially free" it is intended that the component is not intentionally added to compositions of the disclosure. Use of the term "substantially free" of a component allows for trace amounts of that component to be included in compositions of the disclosure because they are present in another component. However, it is recognized that only trace or de minimus amounts of a component will be allowed when the composition is said to be "substantially free" of that component. Moreover, if a composition is said to be "substantially free" of a component, if the component is present in trace or de minimus amounts it is understood that it will not affect the effectiveness of the composition. It is understood that if an ingredient is not expressly included herein or its possible inclusion is not stated herein, the disclosure composition may be substantially free of that ingredient. Likewise, the express inclusion of an ingredient allows for its express exclusion thereby allowing a composition to be substantially free of that expressly stated ingredient.

The term "comprise," "comprises," and "comprising" as used herein, specify the presence of the stated features, integers, steps, operations, elements, and/or components, but do not preclude the presence or addition of one or more other features, integers, steps, operations, elements, components, and/or groups thereof.

As used herein, the transitional phrase "consisting essentially of" means that the scope of a claim is to be interpreted to encompass the specified materials or steps recited in the claim and those that do not materially affect the basic and novel characteristic(s) of the claimed invention. Thus, the term "consisting essentially of" when used in a claim of this invention is not intended to be interpreted to be equivalent to "comprising."

As used herein, the terms "increase," "increasing," "increased," "enhance," "enhanced," "enhancing," and "enhancement" (and grammatical variations thereof) describe an elevation of at least about 1%, 5%, 10%, 15%, 25%, 50%, 75%, 100%, 150%, 200%, 300%, 400%, 500% or more as compared to a control.

The terms "preferred" and "preferably" refer to embodiments that may afford certain benefits, under certain circumstances. However, other embodiments may also be preferred, under the same or other circumstances. Furthermore, the recitation of one or more preferred embodiments does not imply that other embodiments are not useful, and is not intended to exclude other embodiments from the scope of the present disclosure.

The above described features and additional embodiments will be described in detail in the sections that follow and are exemplified by the following figures and detailed description.

BRIEF DESCRIPTION OF THE DRAWINGS

The embodiments set forth in the drawings are illustrative and exemplary in nature and not intended to limit the subject matter defined by the claims. The following detailed description of the illustrative embodiments can be understood when read in conjunction with the following drawings, where like structure is indicated with like reference numerals and in which:

DETAILED DESCRIPTION

Embodiments of the present disclosure are described herein. It is to be understood, however, that the disclosed embodiments are merely examples and other embodiments can take various and alternative forms. The figures are not necessarily to scale; some features could be exaggerated or minimized to show details of particular components. Therefore, specific structural and functional details disclosed herein are not to be interpreted as limiting, but merely as a representative basis for teaching one skilled in the art to variously employ the embodiments. As those of ordinary skill in the art will understand, various features illustrated and described with reference to any one of the figures can be combined with features illustrated in one or more other figures to produce embodiments that are not explicitly illustrated or described. The combinations of features illustrated provide representative embodiments for typical applications. Various combinations and modifications of the features consistent with the teachings of this disclosure, however, could be desired for particular applications or implementations.

Described herein are synthetic, or cultured diamonds, which have at least one artificially embedded inclusion(s) incorporated within their crystal structure during the diamond's synthesis, deposition or growth process.

Figure 1A:
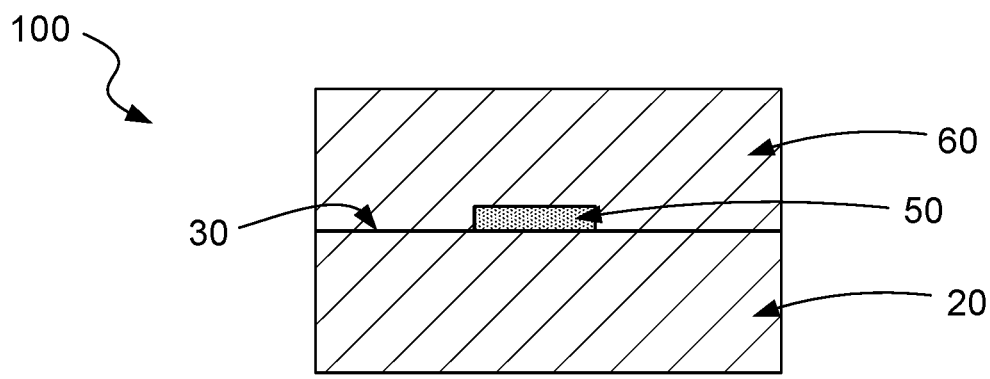
FIG. 1A depicts a cross-sectional side view of a cultured diamond during its synthesis process having an artificially embedded inclusion therein

In one embodiment, as depicted in FIG. 1A, a cultured diamond 100 is disclosed. For purposes of this embodiment and following embodiments, the terms "cultured diamond" or "diamond" are used interchangeably and refer to synthetic, or lab-grown diamonds. The diamond 100 has:

a substrate portion 20;

at least one artificially embedded inclusion 50 disposed on the substrate portion 20; and an encapsulating portion 60, formed on the artificially embedded inclusion 50.

The substrate portion 20 and the encapsulating portion 60 are bonded together by covalent carbon to carbon bonds. That is to say, both the substrate portion 20 and the encapsulating portion 60 are comprised of a diamond and have an un-interrupted, continuous crystal lattice structure which is created during the deposition process of the encapsulating portion 60 onto the substrate portion 20. In a diamond, every carbon atom is covalently bonded to four other carbon atoms and each carbon has a tetrahedral geometry. The substrate portion 20 and encapsulating portion 60 are only described herein as separate structures, not because they are physically separate structures, but because they are temporally separated in their deposition process. Meaning that the substrate portion 20 is formed first during a synthetic diamond deposition process, the process is halted and the at least one artificially embedded inclusion 50 is disposed on the substrate portion 20, then the deposition process can begin gain, wherein the encapsulating portion 60 is thereafter deposited onto and around the artificially deposited inclusion 50 and also onto the substrate portion 20. When the deposition process of the encapsulating portion is occurring, covalent carbon to carbon bonds are formed between the diamond structure of the substrate portion 20 and the diamond structure being deposited as part of the encapsulating portion 60, and as such the two temporally separated depositions create one unitary diamond 100, with a continuous crystal lattice diamond structure, having the artificially embedded inclusion 50 located therein.

The substrate portion 20 and/or the encapsulating portion 60 are formed by known diamond deposition or synthesis processes. Such processes known in the art include chemical vapor deposition (CVD) methods, such as hot filament chemical vapor deposition (HFCVD) and microwave plasma chemical vapor deposition (MPCVD), or high pressure high temperature (HPHT) process.

In a preferred embodiment, both the substrate portion 20 and the encapsulating portion 60, and optionally the at least one artificially embedded inclusion 50 are all formed a by chemical vapor deposition (CVD) process.

Figure 1B:
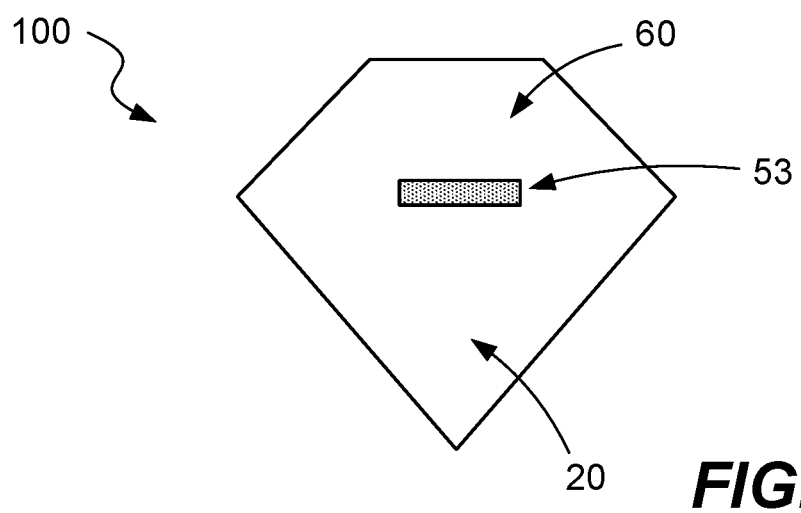
FIG. 1B depicts a cross-sectional side view of a cut cultured diamond having an artificially embedded inclusion therein.

In an embodiment, the at least one artificially embedded inclusion 50 comprises human-readable or machine-readable indicia. This can be seen in FIG. 1B, where a human readable or machine readable indicia 53 is embedded within the diamond 100. The indicia 53, in one embodiment, is an authentication identifier, a QR code, a bar code, an alphanumeric marking, written text, a personalized inscription, an image, a decorative design, a symbol, a pattern, a logo, or a combination of any of the foregoing human-readable or machine readable indicia.

When referring to human-readable indicia 53, it is understood that this includes images or text or any form of indicia which is visible to the human eye, either naturally, or through a magnification device or process, including 1× to 100× magnification devices or processes. For example, the human-readable indicia 53 which is artificially embedded within a diamond 100 can include an authentication identifier, a QR code, a bar code, an alphanumeric marking, written text, a personalized inscription, an image, a decorative design, a symbol, a pattern, a logo, which might not be visible to the naked eye, but can be see using a magnifier, a microscope or a jeweler's loupe or other type of magnification device and technique. For example, a triplet magnifying loupe will provide 10× magnification from which a human-readable indicia, embedded within the diamond 100, can be detected and viewed.

Figure 1C:
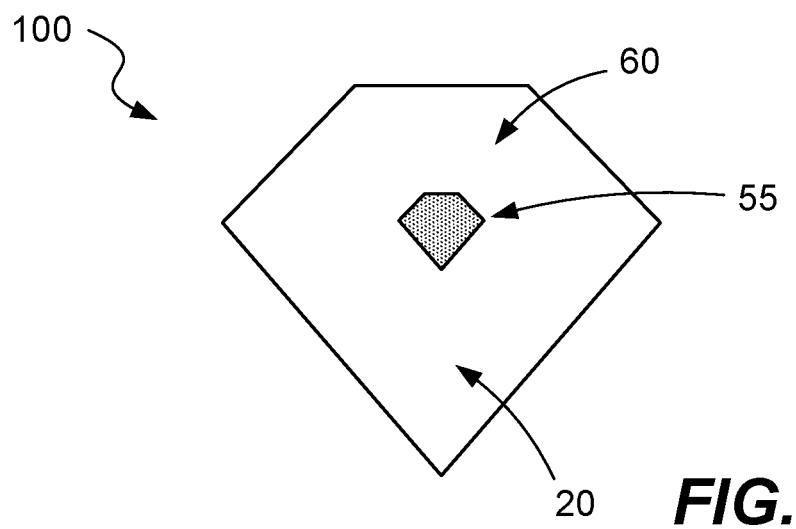
FIG. 1C depicts a cross-sectional side view of a cut cultured diamond having a secondary gemstone embedded therein.

If the indicia 53 which is artificially embedded within the diamond 100 is a machine-readable indicia (also referenced as element 53 in FIG. 1), such as a QR code, bar code, other type of authentication identifier, a pattern, an alphanumeric code, written text, an image, a decorative design, a symbol, or a logo, this may also be detectable by the human eye, but can also be machine-readable in that it can be scanned and identified through a machine or a scanning system which is designed to scan and identify the indicia. A scanning system can be configured to scan the machine-readable indicia 53, and send a signal a controller indicative of the information of the machine-readable indicia 53. The scanner in this embodiment may be any device or sensor capable of scanning the machine readable indicia 53, such as, for example, a camera, a barcode scanner, or the like. As discussed above, the information contained within the machine-readable indicia 53 can include for example a web address, information regarding the authenticity and/or origin of the diamond 100, or related item that the diamond 100 can be attached to. In embodiments, the information may include a blockchain used for identifying or authenticating information relating to the diamond 100, or related item. Other type of information which will be related to the diamond 100, and available through the scanning of the machine-readable indicia 53 includes, clarity grade or category, cut type, color, origination, dimensional size, chemical makeup, Carat weight, luminosity, inclusions, certifications, ownership, and the like.

In one embodiment, the human readable or machine readable indicia 53 is comprised of at least one material layer 58 formed on the substrate portion 20. Referring now to the embodiment depicted in FIGS. 2A, a material layer 58 is deposited on a planar surface 30 of the substrate portion 20 of the diamond 100. The planar surface 30 is the upper surface that is created as the deposition process of the substrate portion 20 ends. Once the deposition or synthesis process of substrate portion 20 concludes, the planar surface 30 is available for the deposition of the next layer, the material layer 58. Prior to deposition of the one or more material layer 58, there may be a pretreatment step for the planar surface 30 so as to prepare the surface for the deposition of the one or more material layer 58. Such pretreatment steps will be described in further details in later portions of this disclosure.

Figure 2A:
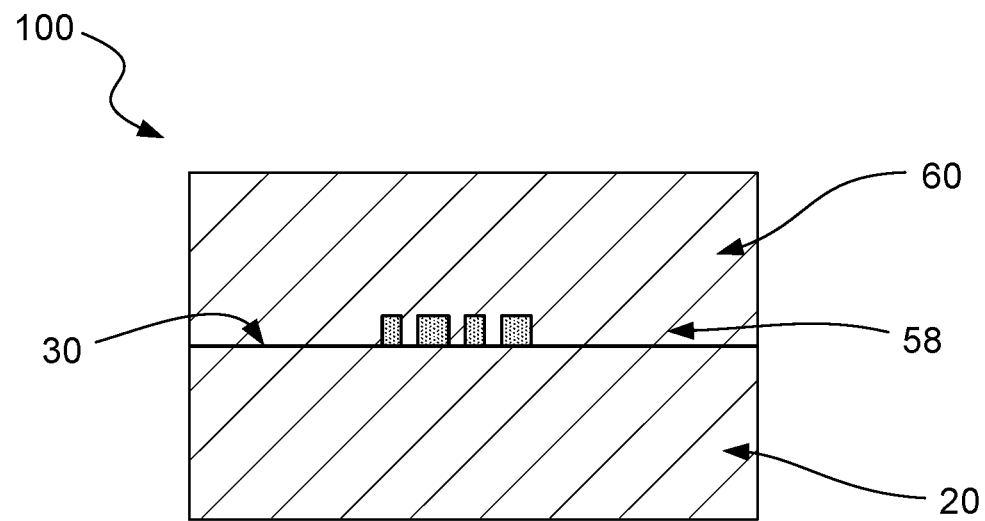
FIG. 2A depicts a cross-sectional side view of a cultured diamond, during its synthesis process, as disclosed herein.

In one embodiment, as show in FIG. 2A, the material layer 58 is first deposited as a continuous homogenous layer (not shown), and is subsequently etched or patterned to remove portions of the deposited continuous layer, so that the material layer 58 which remains, forms the human readable or machine readable indicia 53.

Figure 3A:
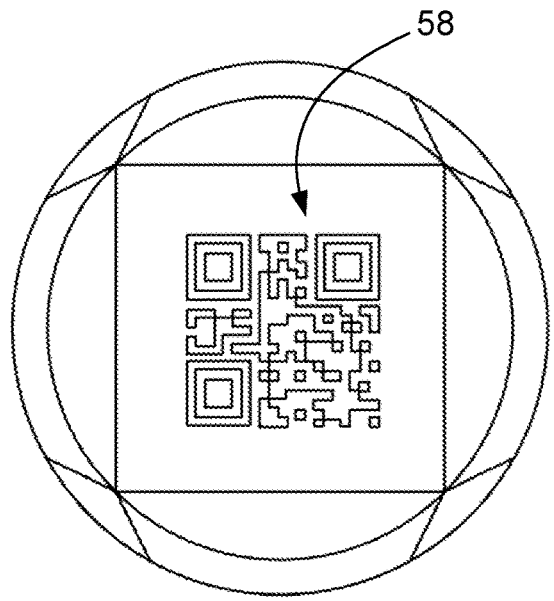
FIG. 3A schematically depicts a top view of a round brilliant cut diamond having artificially embedded inclusion therein, in accordance with one embodiment of the present disclosure.
Figure 3B:
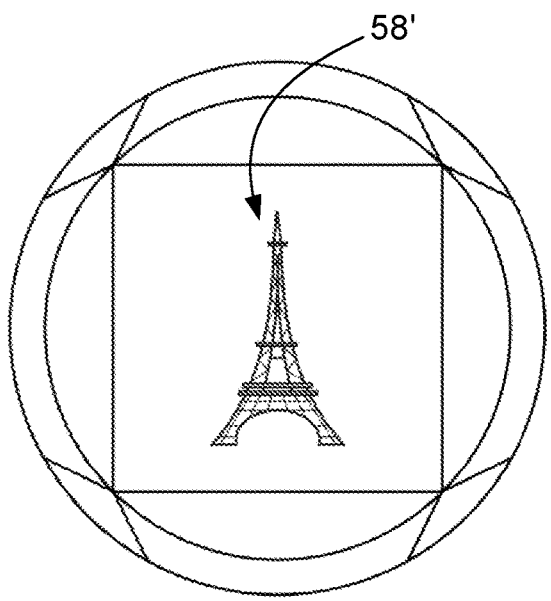
FIG. 3B schematically depicts a top view of a round brilliant cut diamond having artificially embedded inclusion therein, in accordance with one embodiment of the present disclosure.
Figure 3C:
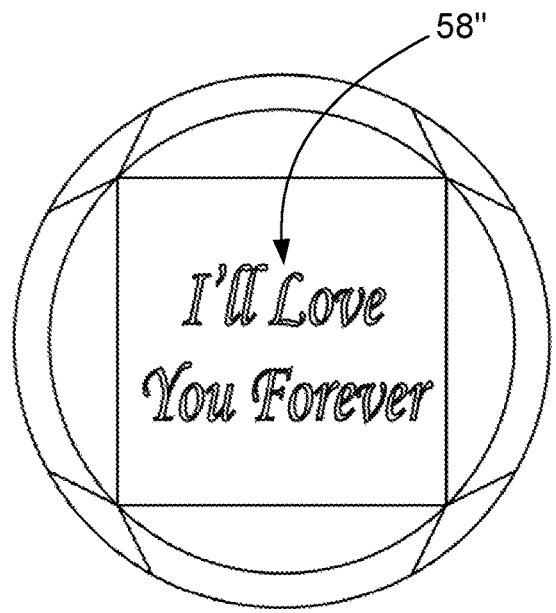
FIG. 3C schematically depicts a top view of a round brilliant cut diamond having artificially embedded inclusion therein, in accordance with one embodiment of the present disclosure.

For example, in the embodiment depicted in FIG. 3A, once material layer 58 is patterned into the desired machine readable indicia 53, it takes the final form of a scannable QR code. In a further embodiment, as depicted in FIG. 3B, the material layer 58' can be etched or patterned so as to form a desired image. Material layer 58' has been formed to replicate an image of the Eiffel tower. This type of image may be desirable in instances where a specific location is meaningful to the person receiving the diamond. In instances when an engagement happens in a particular iconic location for example, it might be meaningful to the recipient of the diamond to have a commemorative image of the location of the engagement, so that symbolic aspect of that location can be preserved within the image presented in the diamond 100. In an even further embodiment, as can be seen in FIG. 3C, the material layer 58" is etched or otherwise patterned to leave a personalized text inscription. The indicia 53 may be sized relative to the size of the diamond 100, such that an increase in the size of the diamond results in an increase in the size of the indicia. It is further contemplated and possible that the indicia 53 may be any size capable of fitting within the diamond 100 and being readable, such as, for example, having a width that is equal to or greater than 0.1 mm, or greater than 0.25 mm. In a further example, the indicia 53 may be visible and/or scannable with a magnification in a range between 1× and 1000× magnification, such as by a microscope, or between 1× and 10×, such as by a camera on a cell phone. The size of the indicia will thusly vary, and may depend on whether the indicia is meant to be a decorative indicia viewable with the human eye, or if it meant to be an identification or authentication type indicia, in which case it need to be prominently displayed and may have a considerably smaller size, as long as it is capable of being scanned by a scanning device used for machine readable indicia. Although the images of FIG. 3A-3C display centrally located indicia within a viewing angle from a top portion of the diamond, the indicia 53 may be located in any portion of the diamond and need not be centrally located. The final cut and shaping of the diamond may determine the location of the indicia.

In an embodiment, the material layer 58 is comprised of non-transparent material, including graphite, graphene, a metal oxide compound, a metallic compound, a pigmented compound, or a combination thereof. Metallic compounds that can be incorporated as the material layer 58 are tungsten, gold, platinum, or palladium, or combinations thereof. The metallic compounds can also comprise a refractory metal. Refractory metals to be used can be, but are not limited to, tungsten and molybdenum.

The reason for incorporating the above mentioned materials for the material layer 58, is because indicia such as authentication identifiers, including barcodes, QR codes, or alphanumeric text, requires contrast between the indicia and the background that the indicia is positioned on. For example, a QR code should have a darker appearance than the medium it is printed or disposed on, so that the barcode may be recognizable and/or scannable by a scanning device. Without this contrast, the barcode may not properly be identified by a scanner. Similarly, with human-readable indicia, color contrast will be required between the deposited indicia and the substrate portion 20 or the encapsulating portion 60, for that indicia to be visible and discernable either through the naked eye, or through magnification, as previously discussed above.

Once the material layer 58 has been deposited on the planar surface 30 of the substrate portion 20, it is then formed into the human-readable or machine readable indicia of choice. For example, one or more graphite layers, which can make up the material layer 58, are deposited on the planar surface 30 of a diamond substrate portion 20 (FIG. 2A). This graphite layer then needs to be treated so that the desired indicia can be formed. For example laser ablation, micro-laser inscription, wet etching, ion milling, ion beam irradiation, maskless lithography processes, photoresist masking process, or a combination thereof can be carried out to form the final indicia that is desired. Such methods of forming images or patterns or text on substrates are known in the art.

Alternatively, in another embodiment, instead of depositing a continuous material layer 58, the image or QR code, or barcode, or other desired indicia can be directly formed or printed onto the planar surface 30 of the substrate portion 20. This can be achieved through various techniques known to those skilled in the art, including direct laser writing techniques, such as femtosecond laser micro-marking, microprinting, sputter deposition, additive printing, pulsed laser deposition, laser-induced graphitization of an existing diamond surface (using a femtosecond laser), laser-induced graphitization of the sub-surface interior of a diamond using adaptive optics that correct for any aberrations caused by refractive index mismatch at the diamond's surface using a picosecond laser, or a combination thereof.

Figure 2B:
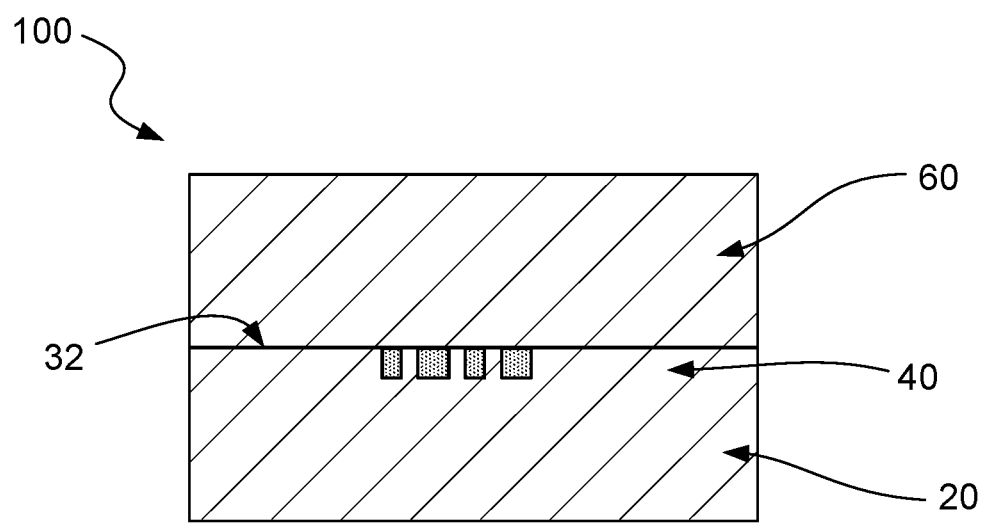
FIG. 2B depicts another cross-sectional side view of a cultured diamond, during its synthesis process, as disclosed herein.

In further embodiments, the deposition of the least one material layer 58, occurs on a non-planar surface 32 of the substrate portion 20. This embodiment is depicted in FIG. 2B, which shows the substrate portion 20, having a non-planar surface 32 formed thereon. The non-planar surface 32 is defined by multiple cavities 40, which are formed onto the surface layer of the substrate portion 20. Instead of first depositing a material layer 58, then using laser ablation or etching to pattern that layer into a desired indicia (FIG. 2A), this embodiment first form grooves 40 within the substrate portion 20, then deposits at least one material layer onto the non-planar surface 32, so as to fill the grooves 40 and form the desired indicia. In this embodiment, it is understood that the grooves 40 which are formed on the surface 32 of the substrate portion 20, are formed in a pre-selected design, including pre-selected text, QR code, barcode, patterned design, logo, image, personalized inscription, or other indicia, prior to the material layer 58 material being deposited to fill the cavities with the previously discussed materials which will ultimately form the human readable or machine readable indicia.

For example, grooves 40 can be formed through laser ablation, micro-laser inscription, wet etching, maskless lithography, a photoresist etching process, or other known patterning techniques known to those skilled in the art that are suitable for creation of indicia on a diamond surface. Once grooves 40 are formed, then the at least one material layer 58 is deposited onto the surface 32 of the substrate portion 20. The material layer deposition can be repeated so that the grooves 40 are filled with the material, up to the surface, or close to the surface boundary of surface 32. A heat treatment process can optionally be conducted so that the material that is deposited within grooves 40, can be sintered or otherwise permanently fixed within the cavities. Thereafter the surface 32 can be pretreated, prior to the deposition process which will form the encapsulating portion 60 on top of and or around the grooves 40, and the substrate portion 20. Pretreatment of the surface 32 can include a cutting step, a cleaning step, a nucleating step, wherein the surface is treated to increase nucleation density or nucleation sites for subsequent carbon bonding during a the deposition process of the encapsulating portion 60, or a combination of said steps. Pretreatment steps for the surface of the substrate portion will be described in more detail in later sections of this disclosure.

In another embodiment, the artificially embedded inclusion 50, comprises a secondary gemstone. As can be seen in the embodiment depicted in FIG. 1C, a secondary gemstone 55 is incorporated into the diamond 100 internal crystal structure, with methods which will be further described herein. In embodiments, the secondary gemstone 55 comprises a diamond, such as a gray diamond, white diamond, blue diamond, yellow diamond, orange diamond, red diamond, olive diamond, green diamond, pink diamond, violet diamond, brown diamond, black diamond, or other color variation of diamond known in the art. The secondary gemstone can be a naturally occurring gemstone, or a synthetic cultured gemstone. In further embodiments, the secondary gemstone 55 is garnet, ruby, olivine, peridot, sapphire, diopside, emerald, amethyst, topaz, citrine or other known gemstones, including precious stones, semi-precious stones, quartz formations, or a combination thereof.

In one embodiment, prior to a secondary gemstone 55 being embedded within the crystal lattice structure of diamond 100, it may require pretreatment in order to increase nucleation sites and/or nucleation density. Diamond crystal structures do not typically grow on non-diamond materials, unless there is a nucleation enhancement step, to increase the availability of carbon bonding sites, so that a diamond crystal lattice structure can be grown/deposited and the required covalent carbon to carbon bonds can form. This step is also sometimes also referred to as seeding. Nucleation is generally a thermodynamically driven process where clusters of atoms or nuclei evolve to form stable phases. In non-diamond substrates, such as the secondary gemstones, disclosed herein, pretreatment for the increase of nucleation sites and/or density can be achieved by methods including, electrostatic seeding with diamond nanoparticles, polishing with diamond grit, chemical nucleating solutions, comprising for example adamantane powder, mechanical surface roughing, or other known techniques, which will be understood by those skilled in the art as increasing the nucleation sites of non-diamond substrates to achieve diamond deposition and carbon-carbon covalent bond formation.

One of the most successful seeding techniques for growth of nanocrystalline diamond on non-diamond substrates is the electrostatic seeding technique, which utilizes diamond nanoparticles. In this process a non-diamond substrate is coated with diamond nanoparticles before growth or deposition of a diamond layer. For example, once the coated substrate is exposed to CVD conditions, individual diamond crystals will start to grow. At the beginning, the growth may be localized to specific individual crystal or islands, and as the deposition process continues, the islands become big enough to coalesce and show columnar crystalline growth, and bulk diamond deposition can be achieved. Generally the substrates are coated with the nanocrystalline diamond seed by dipping in a seed containing solution or by electrospraying, or by and spin-coating the solution onto the non-diamond substrate.

In some embodiments, the pretreatment step can enhance nucleation through mechanical surface roughening or polishing of the secondary gemstone 55, using diamond grit. For example, the secondary gemstone 55 may be hand polished with a diamond paste. The diamond paste can contain diamond particles of micron size, such as particles of 1-20 µm, or 5-10 µm. While not intending to be bound by theory, it is believed that the mechanical surface roughening by polishing with diamond particles, causes nano or micron sized defects on the surface of the substrate being treated and also lodges small diamond particles within these defects, which in turn increases the nucleation density or nucleation sites for future diamond deposition.

In another embodiment, the pretreatment step can include the use of a chemical nucleating solution to induce chemical nucleation sites. This can be accomplished for example through the use of a solution comprising what are known as diamondoids. Diamondoids are molecules which are also sometimes referred to as nanometer-sized diamond molecules, with one such example being adamantane, which is available in a polycrystalline powder form. The adamantane powder is dissolved in a solution of hexane or ethanol and the non-diamond substrate, i.e. the secondary gemstone 55, can be sonicated in the solution prior to deposition. After sonication the substrate is washed in ethanol, prior to being introduced in a CVD reactor for diamond deposition thereon.

Figure 2C:
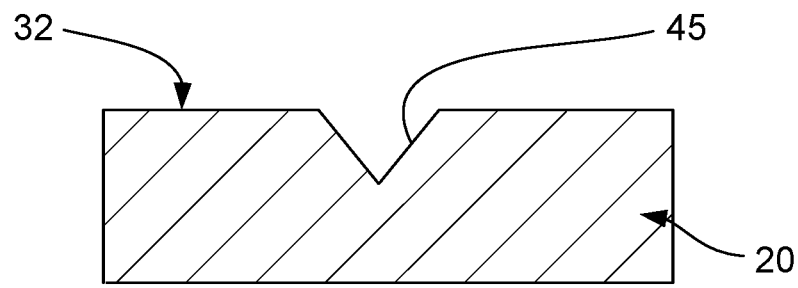
FIG. 2C depicts a cross-sectional side view of a substrate portion of a cultured diamond, as disclosed herein.
Figure 2D:
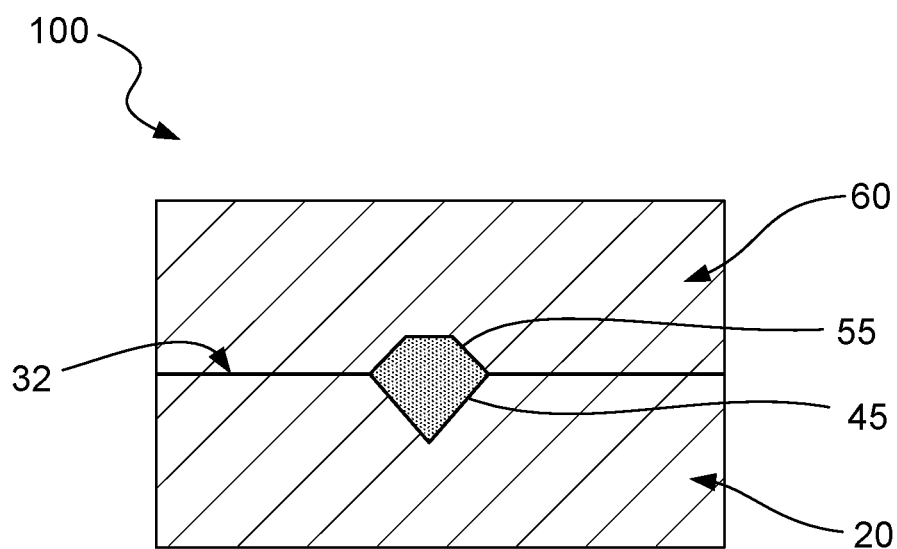
FIG. 2D depicts a cross-sectional side view of a substrate portion of a cultured diamond, having a secondary gemstone embedded therein, in accordance with an embodiment of the present disclosure.

Referring now to FIGS. 2C-2D, a further embodiment will be described, wherein the secondary gemstone 55 is incorporated onto a cavity 45 formed onto the substrate portion 20. The cavity 45 is incorporated onto the surface of the substrate portion 20, thereby resulting in a non-planar surface 32. The shape of the cavity 45, although shown as "V"-shaped in the depiction of FIG. 2C-2D, can take any shape and is preferably formed in the shape corresponding to the secondary gemstone 55 that is to be placed therein. As can be seen in the embodiment shown in FIG. 2D, the secondary gemstone 55, is disposed and fits within the cavity 45, in a corresponding shape, and is thus physically anchored therein. Prior to the placement of the secondary gemstone 55 within the cavity 45, a bonding agent can be applied to the cavity so that the securement of the gemstone 55 can be assured. This is however not a required step. By placing the secondary gemstone 55 within the cavity 45, the gemstone is mechanically anchored and oriented within the substrate 20, so that the deposition of the encapsulating portion 60 can be carried out and the secondary gemstone 55 is secured and stable during the deposition process. Because the gemstone has been pretreated to increase nucleation sites and/or nucleation density, once it is exposed to a CVD chamber and with reactant gases, deposition of a diamond layer will occur on the secondary gemstone 55 surface, and on the surface of the substrate portion 20, thereby forming carbon-to-carbon covalent bonding with both the diamond surface of the substrate portion, and also the non-diamond surface of the gemstone 55. In some embodiments where the secondary gemstone 55 is also a diamond, a pretreatment step for enhancing nucleation is also carried, out to ensure proper bonding and crystal lattice formation during deposition of the encapsulating portion 60. Additionally, in some embodiments, the surface 32 of the substrate portion 20 is also pretreated for cleaning and for nucleation enhancement, prior to deposition of the encapsulating portion 60. The surface of the substrate 20 may be polished or cut so as to create an atomically flat surface. For example, during laser etching or milling to create the cavity 45, various debris may be deposited, or damage may be caused to the surface of the substrate portion 20. As such, it may be preferred to clean and pretreat the surface prior to placing the substrate portion 20 back into a CVD deposition chamber for growth of the remaining encapsulating portion 60.

As previously disclosed, the encapsulating portion 60 is deposited onto the secondary gemstone 55 and onto the substrate portion 20 by any known diamond deposition or diamond formation process, such as chemical vapor deposition (CVD), which includes hot filament chemical vapor deposition (HFCVD) and microwave plasma chemical vapor deposition (MPCVD). Alternatively, an HPHT process can also be used to form either the substrate portion 20, the encapsulating portion 60, or both.

In further embodiments, the artificially embedded inclusion(s) can include not only secondary gemstones and indicia, but a combination of both, including at least one secondary gemstone and at least one human readable or machine readable indicia. The location of said inclusions can vary. For example, a machine readable inclusion can be created in a layer which is close to the surface portion of the final cut diamond, while a secondary gemstone can be incorporated to be centrally located within the final diamond 100, or can be in a lower location from the table of the final diamond 100. The inclusions can be spatially separated, so that when viewing the diamond from a top portion, all inclusions are viewable and do not overlap. Alternatively, if a decorative pattern is being formed, some overlap of various inclusions may be desirable to create specific three dimensional pattern within the diamond 100. Therefore, it is envisioned that the inclusions can be incorporated at any part of the diamond 100 structure, and in various layers, although in the Figures they are displayed as being located centrally within the diamond 100. This is for illustration purposes only and is not intended to be a limiting orientation, or location or placement within the diamond 100.

In additional embodiments, a cultured diamond 100 is disclosed, the diamond having:
  a substrate portion comprising a diamond;
    at least one inclusion(s) comprising one or more non-diamond carbon layer (s); and
    an encapsulating portion comprising a diamond, formed onto the at least one inclusion(s) and the substrate portion.

The substrate portion and the encapsulating portion are bonded through covalent carbon to carbon bonds. In further embodiments, the at least one inclusion(s) are also bonded to the encapsulating portion through covalent carbon to carbon bonds. In these embodiments, the one or more non-diamond carbon layer(s) refer to deposited graphite layers, deposited graphene layers, deposited amorphous carbon layers, or graphitized layers.

Graphitized layers are not deposited but rather formed from a graphitization process which turns layers of the existing diamond crystal structure of the substrate portion 20 into a graphite sp2 carbon layer(s). Graphitization of a diamond surface layer can be achieved by methods known in the art, such as for example using high pressure high temperature (HPHT) processing of layers in diamond created by focused ion beam (FIB). Graphitized layers can also be created by use of laser irradiation, or pulsed laser irradiation. It is known that focused laser radiation can initiate processes that lead to laser modification of diamonds crystal structure, while using powerful nanosecond, picosecond, and femtosecond lasers operating in the ultraviolet, visible, and infrared ranges. For example, a commercial Ti:sapphire laser can be used to produce pulse widths of 120 femtoseconds (fs) of wavelength of 800 nm. 400 nm, 266 nm, or 200 nm. The surface of the diamond is irradiated with these pulsed parameters at said wavelengths to create graphitization of surface layers of the diamond. This is in essence is a process by which micro-restructuring of carbon layers occurs as a result of local graphitization of the surface due to single- or multi-photon absorption (depending on the laser quantum energy) of powerful laser radiation, which causes the ionization of the sp3-carbon material, resulting in sp2 carbon structures, i.e. graphite formation.

In addition to a graphitized layer, the one or more non-diamond carbon layer(s) refer to carbon containing layers, which are either graphite containing layers, graphene containing layers, or amorphous carbon containing layers. The carbon containing layers can be deposited by known methods, including by chemical vapor deposition methods. For example, the substrate portion, once formed can be prepared for deposition of a graphite layer thereon. This graphite layer can be deposited either in the same CVD reactor where the substrate portion was grown, or in another CVD reactor, or in another type of equipment, using a process capable of depositing graphite layers on diamond substrates. In one embodiment, a CVD reactor is used to deposit the non-diamond carbon layer(s). Reactant gases, including methane and hydrogen enter the CVD reactor, while the reactor is maintained at the appropriate temperatures and pressures for non-diamond species deposition.

One such way of forming graphite layers on substrates is through the deposition of a multitude of graphene layers. Graphene is considered the basic building-block of graphitic materials, and is a two-dimensional, single-atomic layer carbon material consisting of six bonded sp2 carbon atoms that are tightly-packed in a honeycomb lattice. Multiple stacked graphene sheets form a three-dimensional graphite structure. Graphene can be deposited in a CVD reactor using carbon rich gas sources, such as methane. Graphite layers can therefore be formed during sustained multi-graphene layer deposition process, which is stopped once the desired film growth has been reached. The film growth for these layers may be several nanometers or several microns in height. In one embodiment the non-diamond carbon layer has a height of about 0.1 microns to about 10 microns. Or about 0.5 microns to about 8 microns, or about 1 micron to about 6 microns, or about 2 microns to 5 microns, or about 3 microns to 4 microns or any range or value therebetween.

Graphite layers are typically grown when the substrate of deposition is heated above 900° C. A carbon rich methane reactant gas in the presence of H2 and Argon diluting gases can be used, while the substrate portion is kept at high temperatures, such as above 900° C. The volumetric gas percentages of the reactant gas mixtures will be tailored so as to be optimal for graphite growth, in addition to the reactor pressure and temperatures. Such methods of CVD graphite deposition on carbon containing substrates are known in the art. Other known methods of creating graphite layers include spray coating with a commercially available graphite containing spray, or coating with suspension of graphite platelets prepared by ultrasonic liquid phase exfoliation (LPE), or by abrasion of the surface with high purity graphite powder. Once the deposition of the graphite containing material, whether it be a coating or powder, an annealing step can be conducted using a focalized laser beam, wherein the deposited graphite is then annealed on the surface it has been deposited on. The laser is raster-scanned over the area to be annealed, allowing, for example, spatially variable annealing. With a localized laser spot, a significant amount of heat can be generated on the film in a short amount of time without damaging the substrate underneath. Annealing of deposited graphite layers can also be achieved through heating, such as for example in a furnace, operated at high temperatures, effective for annealing a graphite layer.

In some embodiments, a graphite powder coating can be applied to the substrate portion 20, prior to graphite deposition, or as a part of the graphite deposition step. This graphite powder coating can be annealed onto the surface in a subsequent heating step. During the graphite deposition process, the graphite powder coating can serve as a nucleating layer for further graphite growth during a CVD process, or the graphite powder coating can make up the non-diamond coating layer itself, such that no further CVD process is required and only a coating step is undertaken. A graphite powder coating can be applied to the substrate portion, wherein the coating comprises graphite powder mixed in an alcohol solution. Once the graphite containing solution is applied on the surface of the substrate portion, it can be annealed using high temperatures, wherein the graphite powder remains on the surface an all other species are sintered and or evaporated from the coating.

The graphite layer can then be patterned through laser etching, chemically etching, laser milling, or otherwise removed using a masked or non-masked process (for example using a masking or photoresist process), or otherwise treated so as to create the desired final indicia on the surface of the substrate portion, prior to the final deposition of the encapsulating portion thereon.

Figure 4:
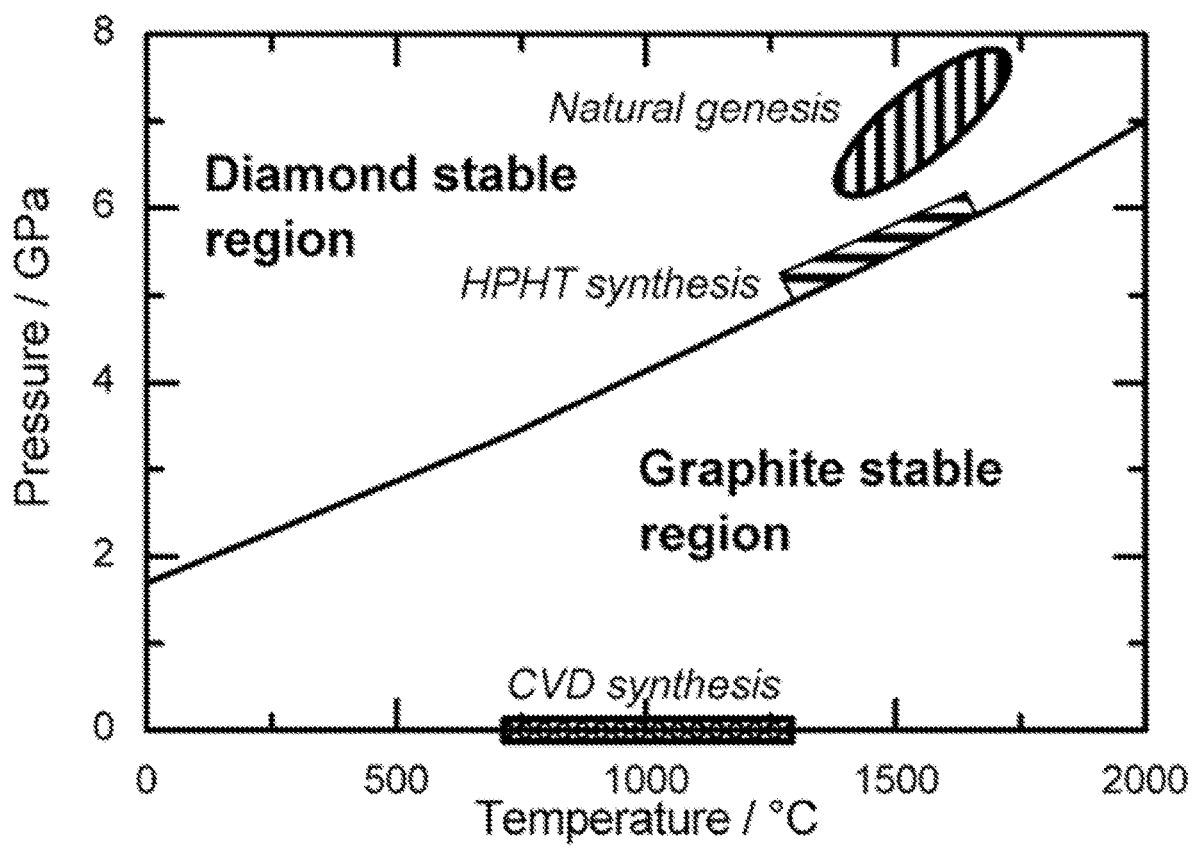
FIG. 4 shows a phase diagram for carbon indicating main regions of pressure-temperature in which diamond growth occurs.

Shown on FIG. 4 is a phase diagram for carbon indicating the main regions of pressure-temperature parameters in which diamond growth can occur. As noted previously, growth of a cultured diamond is typically achieved through CVD processes or through high pressure high temperature process (HPHT). The phase diagram shown in FIG. 4 outlines the pressure and temperature levels for CVD diamond growth and also for HPHT diamond growth. It is notable that CVD deposition processes are low pressure processes, i.e. they happen low pressures or atmospheric pressures, but high temperatures in the region of 700 to 1200° C. Whereas HPHT diamond growth happens in highly pressurized vessel or chamber, also at extremely high temperatures, which mimics the temperature/pressure parameters of natural diamond formation as it occurs in the earth.

Figure 5:
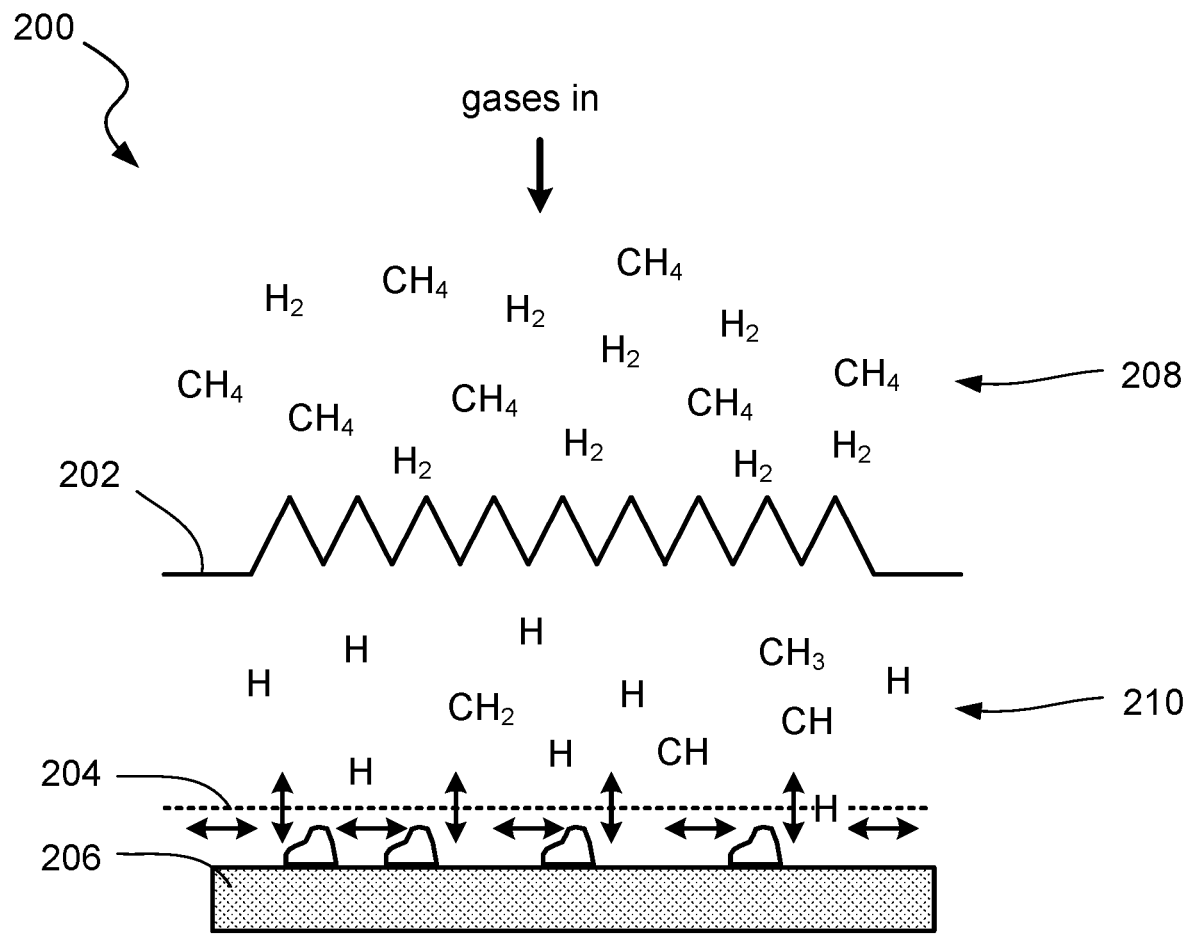
FIG. 5 depicts a schematic of a hot filament chemical vapor deposition process (HFCVD) and reactor used for diamond synthesis.

A schematic of the general elements of a CVD process for diamond growth is shown in FIG. 5. Reactant gases (208) methane CH4 and hydrogen H2 enter the reactor. A hot filament 202 is placed in the path of the reactant gases and near a substrate 206 where deposition and growth will occur. Diamond seeds are placed onto the substrate 206. The filament 202 is heated by passing an electrical current through the filament. The temperature in the deposition chamber is measured by a thermocouple in contact with the substrate holder. The gas mixture of reactant gases 208 diffuses onto the filament and the gas species dissociate into free radicals 210 and form a deposit on the substrate 206 placed below the filament at a distance of about 2-8 mm. The entire process is carried out at low pressures (20-40 torr), and the deposition rate for high-quality diamond films is typically about 1 µm/hr.

The mixture of methane and hydrogen is tailored to yield optimum carbon deposition for diamond growth. The carbon content for deposition onto the diamond seeds comes from the carbon containing gas, methane. Other carbon containing gases, such as acetylene can also be used. Atomic hydrogen is believed to be the most critical determinant of diamond film quality and the growth rate. It is involved in the formation of carbon-containing radical species and the production of H—C bonds on the growing diamond surface, preventing it from reconstructing to a graphite-like structure. Atomic hydrogen also etches the film surface, taking away both diamond and graphite. Under typical CVD conditions, the rate of diamond growth exceeds its' etch rate which does not happen for other carbon structures, and only diamond film remains. Typically the content of methane will be low, for example, 0.3% to 5.0% (volume %), or more preferably 0.5% to 2.5%, as compared to the hydrogen introduced into a CVD reactor.

Figure 6:
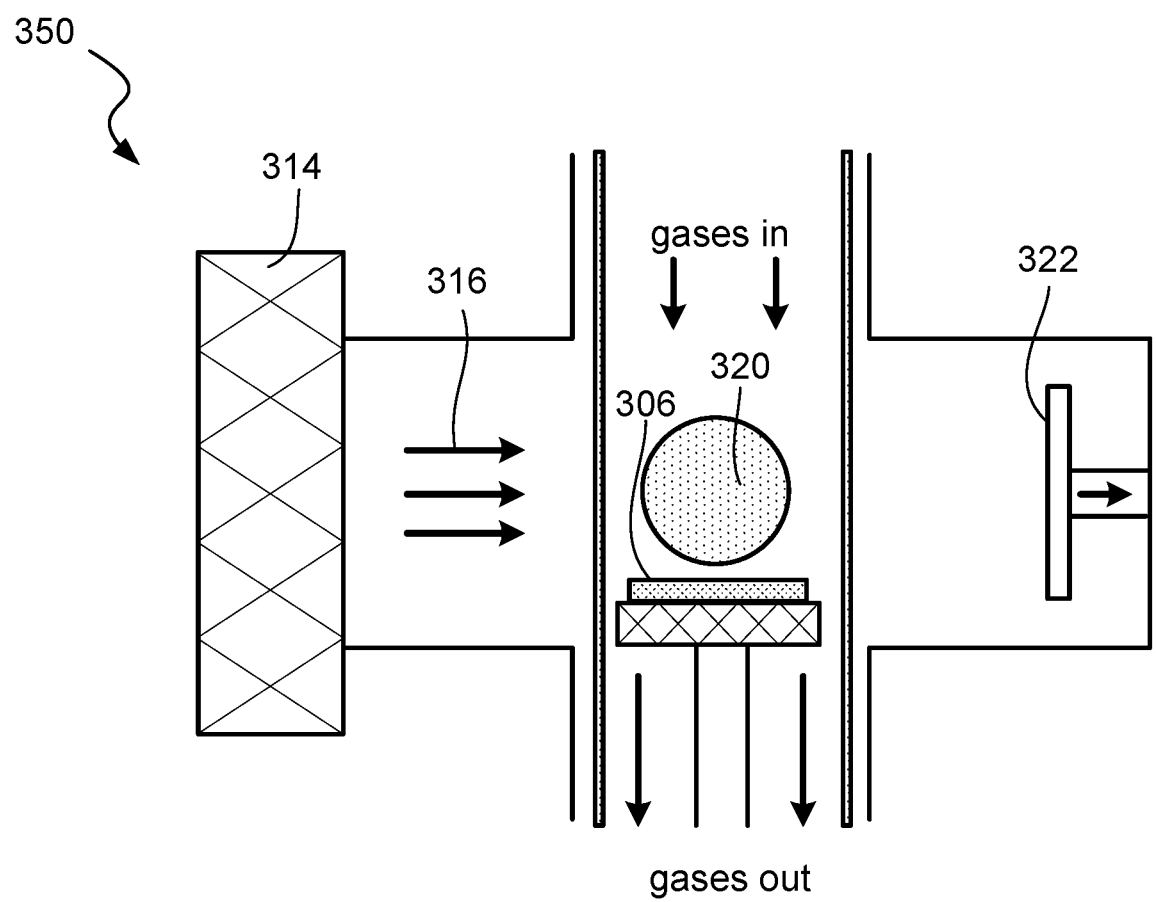
FIG. 6 depicts a schematic of a microwave plasma chemical vapor deposition process (MWCVD) and reactor used for diamond synthesis.

FIG. 6 is a schematic of a microwave plasma CVD process and equipment 350 which is known and commonly used to synthesize diamond structures. Microwave plasma CVD uses electric discharge to produce the radicals necessary for diamond growth. In MWCVD, the microwave power is generated (microwaves) is coupled into the growth chamber via a quartz window in order to generate a plasma discharge. According to the design and the size of the chamber cavity, only one microwave mode is permitted in order to create one plasma ball 320 directly above the substrate 306 surface. The microwave energy 316 is transferred to electrons which oscillate and accelerate the incoming the gases, the free radicals are formed and solid species deposition occurs onto diamond seed(s) located on the substrate 306 which typically is placed within about a millimeter of the generated plasma ball 320. The ionization from the plasma essentially splits molecular bonds within the gases, and the pure carbon is deposited and adheres to the diamond seed(s) and slowly builds up into a larger crystal, atom by atom, layer by layer.

Alternatives to chemical deposition methods, HPHT methods used an entirely different process and equipment for diamond growth. In an HPHT process, a diamond seed is placed in a specifically designed press chamber. The chamber is heated to 1300-1600° C. with pressures above 870,000 pounds per square inch and has within carbon starting material, such as for example graphite. Within the capsule, a carbon starting material, dissolves in a molten flux consisting of metals such as iron (Fe), nickel (Ni) or cobalt (Co), which lowers the temperature and pressure needed for diamond growth. The carbon material then migrates through the flux towards the cooler diamond seed and crystallizes on it to form a synthetic diamond crystal. Crystallization occurs over a period of several days to weeks to grow one or several crystals.

Figure 7A:
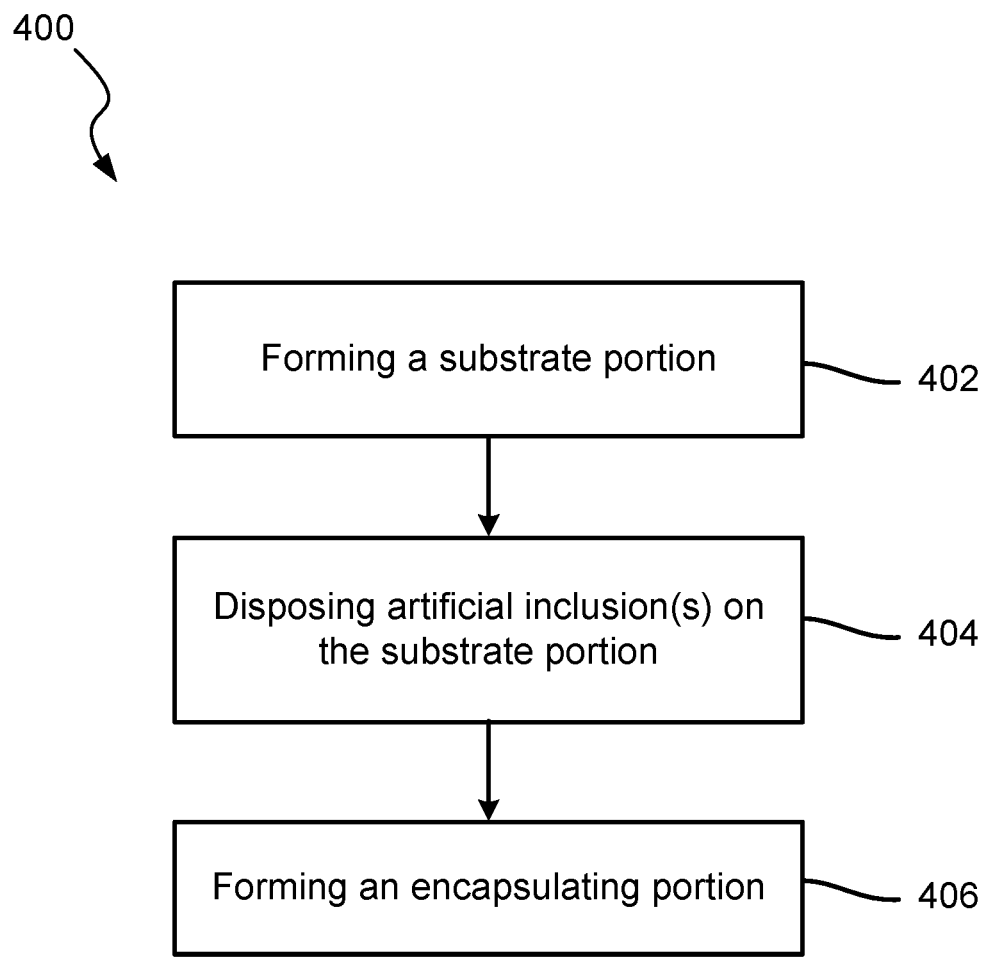
FIG. 7A depicts method steps of embedding an artificial inclusion in a diamond, in accordance with an embodiment disclosed herein.

Methods will now be described to with respect to embodiments of embedding artificial inclusion(s) in a cultured diamond 100. Methods are depicted in sequential steps, as for example in the embodiment shown in FIG. 7A. A method 400 of embedding an artificial inclusion(s) in a diamond, is disclosed, the method comprising the steps of:
 forming a substrate portion (402) comprising a diamond;
 disposing at least one artificial inclusion(s) on the substrate portion (404); and
 forming an encapsulating portion (406) comprising a diamond, onto the artificial inclusion and substrate portion.

In one embodiment, the substrate portion and the encapsulating portion are formed by chemical vapor deposition (CVD), hot filament chemical vapor deposition (HFCVD), plasma enhanced chemical vapor deposition (PECVD), microwave plasma chemical vapor deposition (MPCVD), or a high temperature high pressure (HPHT) process. Due to the various steps of the deposition methods described herein, the final formed cultured diamond will have a uninterrupted diamond crystal lattice between the substrate portion meets the deposited encapsulating portion, wherein carbon to carbon covalent bonds will be present and hence, these will no longer be considered as separate portions of the diamond but will exist as one unified diamond structure.

The step of forming a substrate portion (402) comprising a diamond is for example carried out through any suitably CVD process, which are known to those skilled in the art. For example, one such process is outlined in US published patent applications US 2017/0009376A1, to Khal et al., the relevant contents of which are incorporated herein by reference. The step of forming an encapsulating portion (406) can also carried out using the same method and/or parameters as the formation of the substrate portion.

In one embodiment the disclosed method, the at least one artificial inclusion(s) comprises a secondary gemstone. The secondary gemstone comprises a gray diamond, white diamond, blue diamond, yellow diamond, orange diamond, red diamond, olive diamond, green diamond, pink diamond, violet diamond, brown diamond, black diamond, garnet, ruby, peridot, sapphire, diopside, emerald, amethyst, topaz, citrine, or a combination thereof.

Figure 7B:
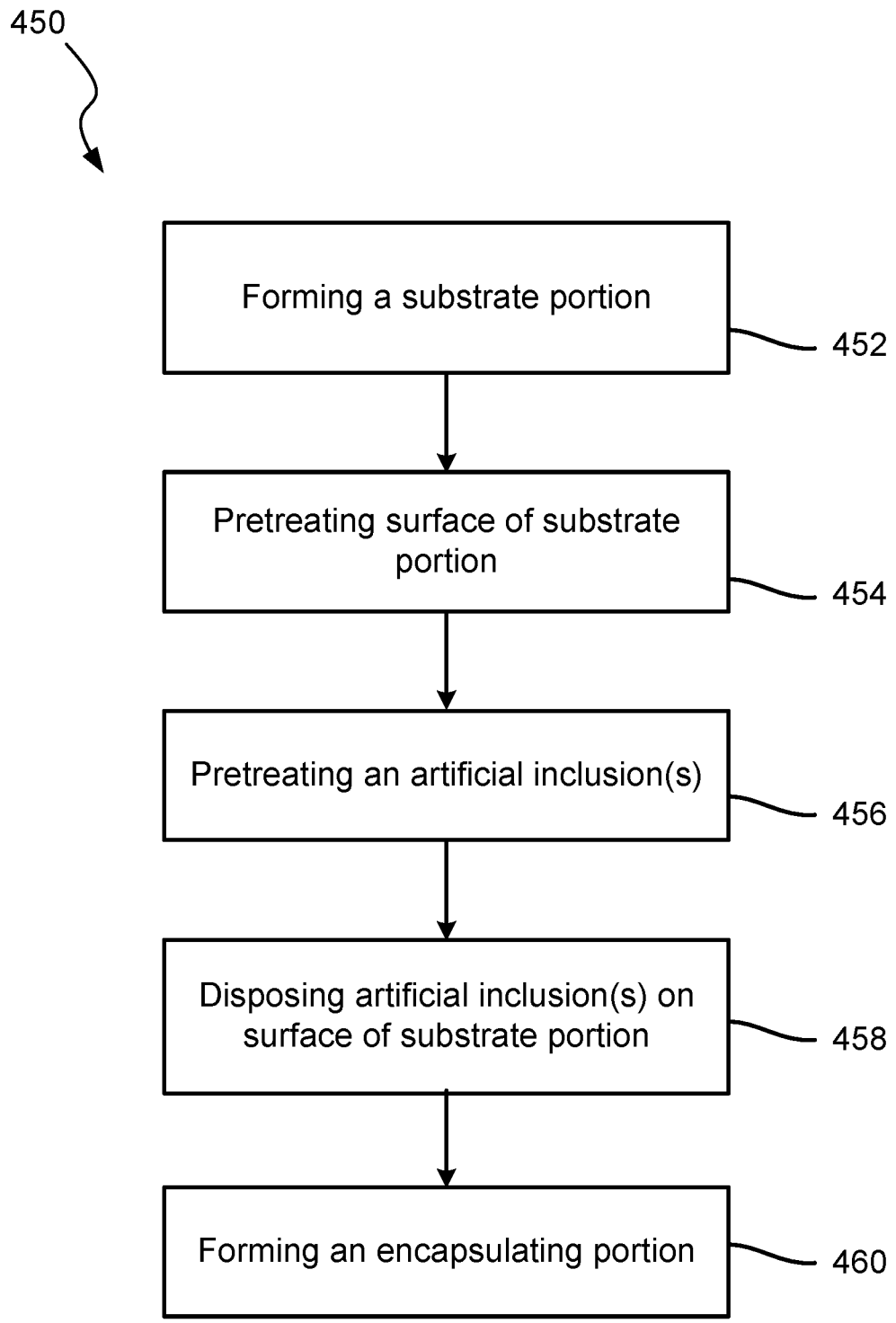
FIG. 7B depicts method steps of embedding an artificial inclusion in a diamond, in accordance with an embodiment disclosed herein.

In another embodiment, a method 450 as shown in FIG. 7B is disclosed. This method 450 incorporates steps 402, 404 and 406 of the previously described method 400, with the addition of pretreatment steps 454 and 456. After formation of a substrate portion, an optional pretreatment step 454 is conducted for the surface of the substrate portion. Additionally a pretreatment step 456 is conducted for the artificial inclusion(s), prior to disposing the artificial inclusion 458 onto the surface of the substrate portion. Followed by formation of the encapsulating portion 460, onto the surface of the substrate portion and on and around the artificial inclusion(s).

A pretreatment step of the surface of the substrate portion 454 can comprise various cutting steps, cleaning procedures and nucleation enhancing procedures. For example, in one embodiment the surface of the substrate portion is cut and polished to form a planar smooth surface, it may also be cleaned remove any amorphous carbon species, or non-diamond carbon species or debris that may be deposited thereon. A cleaning solution can also be utilized to clean the substrate portion prior to an optional nucleation treatment. Various nucleation treatments for purposes of increasing nucleation sites and or nucleation density were described in detail in previous sections of the disclosure, and are additionally incorporated herein. It is envisioned that the substrate portion is removed from the CVD reactor where it was grown, a cutting, polishing, machining, ablation, etching, milling, cleaning, nucleating or other such type process is conducted to prepare the substrate portion for firstly disposing a secondary gemstone thereon, and also for the deposition process of the encapsulating portion onto the substrate portion.

The methods disclosed herein further comprise a step of forming at least one cavity on the surface of the substrate portion and disposing the secondary gemstone within the formed at least one cavity on the surface of the substrate portion. Alternatively, in another embodiment, the secondary gemstone can be disposed on planar surface of the substrate portion, prior to commencement of the deposition and growth of the encapsulating portion. That is to say, a cavity is not formed in this embodiment, and the secondary gemstone is placed on a flat planar, optionally pretreated surface of the substrate portion.

Once the encapsulating portion is formed onto the substrate and onto and around the artificially embedded inclusion within the diamond, the bulk diamond structure can be formed into a final diamond by various means of cutting and polishing known in the art.

Electromagnetic interference (also referred to as "EMI" or "radio frequency interference") is undesirable noise or interference in an electric circuit caused by a source external to the electric circuit. In some cases, such noise or interference can result in poor performance of the electric circuit or functional failure of the electric circuit.

EMI is a result of the close relationship between electricity and magnetism. A changing current can generate a magnetic field, while a changing magnetic field can generate a corresponding electrical current. Electromagnetic fields external to a circuit can induce currents in wires or other conductors included in the circuit, Such induced currents can affect desired currents in the circuits, resulting in performance or functional issues for the circuit.

Sources of EMI can be varied. For example, EMI may be a result of an electromagnetic pulse (or "EMP") or a transient electromagnetic disturbance (or "TED"). EMPs and TEDs, may be caused by naturally occurring phenomena, e.g., lightning, cosmic radiation, solar flares or storms, and the like, and can cause failures or performance issues for electric circuits. In addition to natural phenomena, EMPs and TEDs may be created by man-made devices. For example, malfunctioning or poorly designed electric device can emit radiation that can affect nearby electric circuits. Some nuclear weapons are designed and deployed specifically to generate EMPs that can render electric circuits inoperable. In some aerospace applications, moving a spacecraft or aircraft through the atmosphere can result in a buildup of charge on the spacecraft or aircraft which can affect the avionics of the crafts.

To remediate the effects of EMI, electric circuits are often shielded. One shielding technique involves placing a circuit inside of a Faraday cage (also referred to as a "Faraday shield") or other similar structure. A Faraday cage is formed using a mesh of conductive material that is coupled to a ground supply node. When an external electromagnetic field comes in contact with a Faraday cage, charges within the conductive material of the cage are rearranged such that the charges cancel out the electromagnetic field inside in the cage. By grounding the conductive material of the cage, any induced currents in the cage can be dissipated. With the external electromagnetic field canceled inside of the cage, any circuits inside the cage are shielded from the effects of the external electromagnetic field.

The size of the mesh of a Faraday cage can be selected based on a range of frequencies of electromagnetic radiation from which a circuit needs to be shielded. In some cases, the conductive material of the Faraday cage needs to be kept a sufficient distance away from the circuit being protected to prevent short circuits to the cage material. This added distance can increase the size and cost of the Faraday cage. Additionally, if the mesh of a Faraday cage is sufficiently small to shield against high frequencies, the Faraday cage can inhibit the dissipation of heat generated by the circuit being protected, leading to overheating. The embodiments described herein may provide techniques for shielding electric circuits using diamond-based shield tiles such that the likelihood of shorts is minimized while still providing a thermally conductive path to prevent circuit overheating.

Figure 8A:
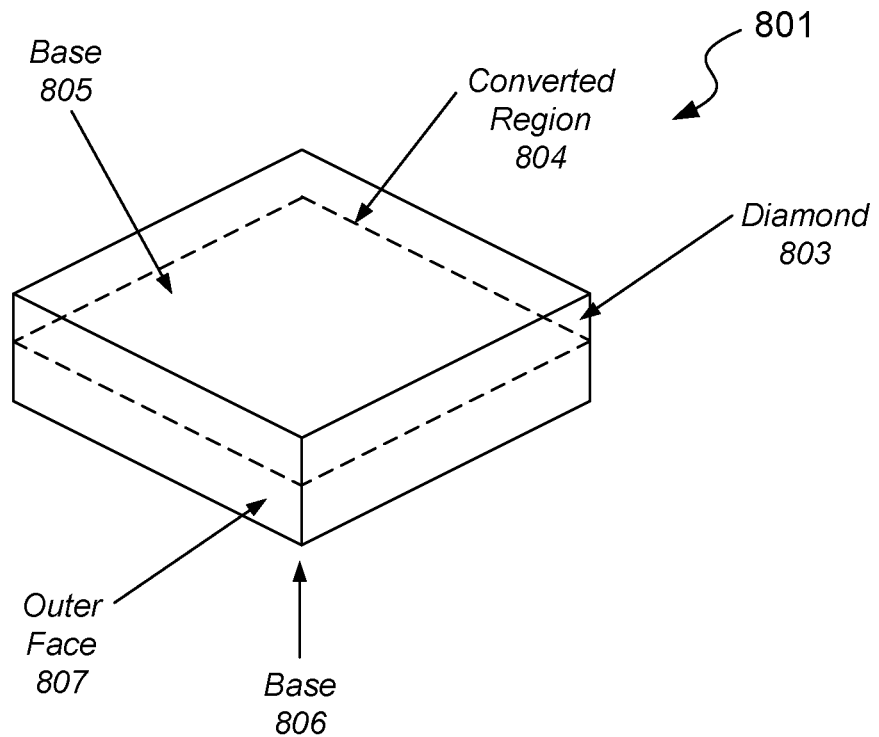
FIG. 8A is a block diagram of an embodiment of a shield tile.
Figure 15A:
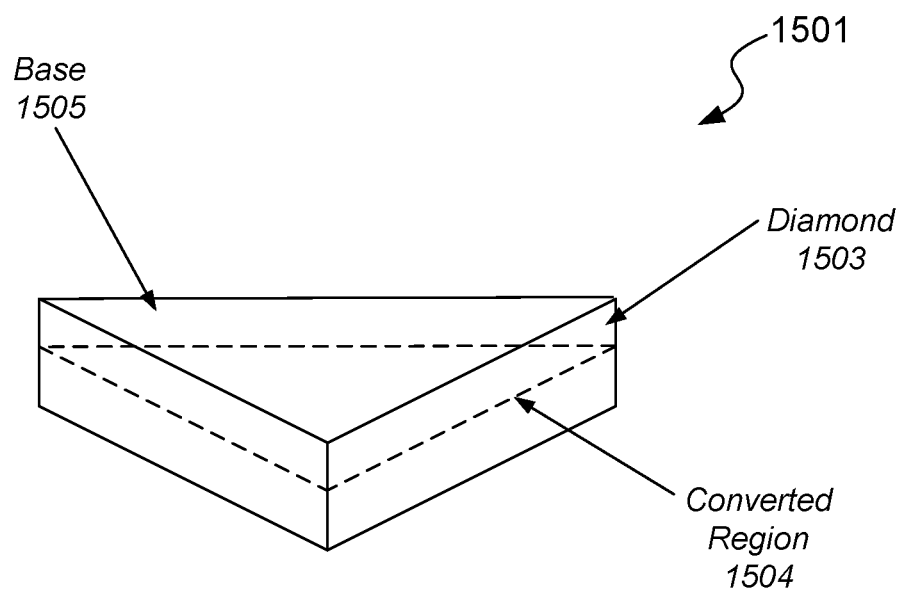
FIG. 15A is a block diagram of an embodiment of a shield tile in a shape of a triangular prism.

Turning to FIG. 8A, a block diagram of an embodiment of an electromagnetic interference shield tile (or simply a "shield tile") is depicted. As illustrated, shield tile 801 includes diamond 803. In various embodiments, shield tile 801 may be in the shape of a prism. As used and defined herein, a prism refers to a polyhedron including a first base that is an n-sided polygon base, a second base which is a translated copy (rigidly moved without rotation) of the first base, and n other faces, necessarily all parallelograms, joining corresponding sides of the two bases. It is noted that prisms can be named after the shape of their bases. For example, if the bases of a prism are triangles, then the prism is referred to as a "triangular prism." Prism 1501, as depicted in FIG. 15A, is an example of a triangular prism.

In the present embodiment, bases 805 and 806 are implemented as squares, making shield tile 801 a square prism. In various embodiments, the distance between base 805 and base 806 can range from 0.01 millimeters to 10 millimeters. In some cases, the distance between base 805 and base 806 may be based on a design considerations such as cost.

Diamond 803 includes converted region 804. In various embodiments, converted region 803 includes at least a portion of the interior volume of diamond 803 that has been converted to graphite using a laser as described above, providing a conductive medium inside of diamond 803. In some cases, converted region 804 extends to a least one of the faces of diamond 803 (e.g., outer face 807). In other embodiments, converted region 804 may extend to all faces of diamond 804 providing a contiguous "edge-to-edge" conductive layer within diamond 803. As described below, converted region 804 may be implemented in a variety of ways. In some cases, converted region 804 may be electrically coupled to a ground supply node in order to form a shield against electromagnetic interference.

Although shield tile 801 is depicted as being a square prism, in other embodiments, shield tile 801 may be implemented using any other suitable shape of prism.

Figure 8B:
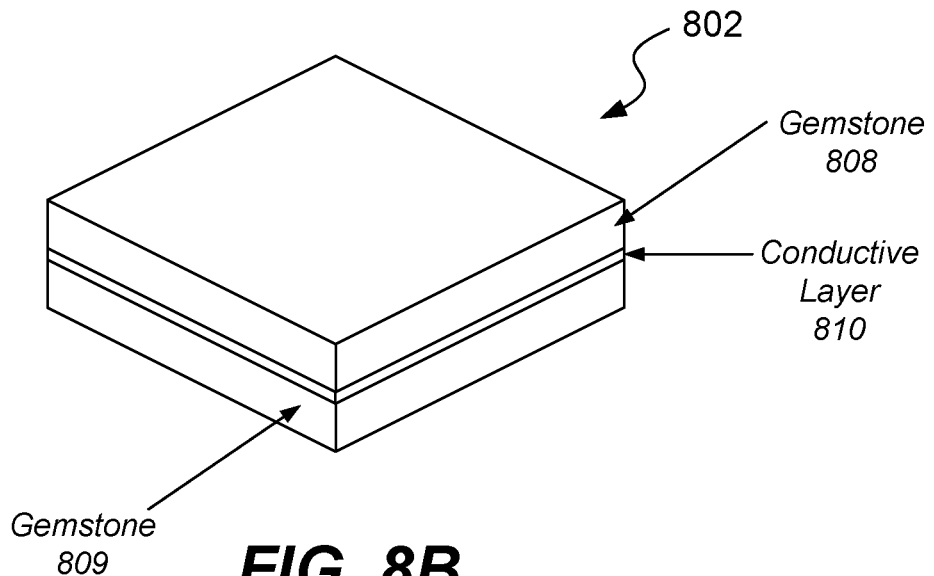
FIG. 8B is a block diagram of a different embodiment of a shield tile.

Turning to FIG. 8B, a block diagram of different embodiment of a shield tile is depicted. As illustrated, shield tile 802 includes gemstone 808, gemstone 809, and conductive layer 810. In the embodiment of FIG. 8B, a prism-shaped shield tile can be assembled using discrete gemstones and conductive material rather than converting a portion of an interior volume of a diamond as described above in regard to FIG. 8A.

In various embodiments, gemstone 808 and gemstone 809 may include a diamond or other suitable transparent gemstone. Such diamonds may be either natural or man-made. In some cases, gemstones 808 and 809 may be discrete gemstones that are coupled together to sandwich conductive layer 810. In other embodiments, gemstone 808 may be formed on top of conductive layer 810 and gemstone 809 using the method described above.

As described below, conductive layer 810 may include graphite, gold, silver, or any other suitable conductor. Conductive layer 810 may, in various embodiments, extent at least one edge of gemstone 809. In some embodiments, multiple graphite lines may be either deposited or etched into gemstone 809 using a laser or other suitable device. In various embodiments, conductive layer 810 may be coupled to a ground supply node in order to form a shield against electromagnetic interference.

Figure 15B:
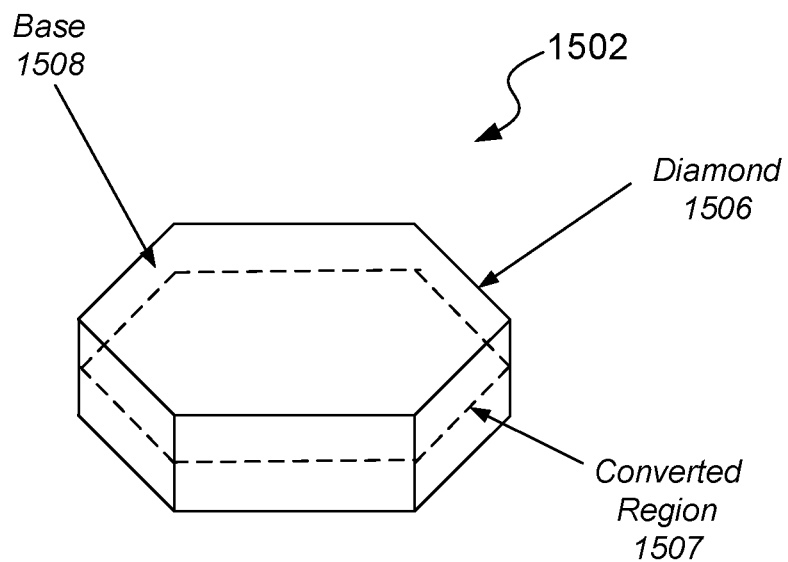
FIG. 15B is a block diagram of an embodiment of a shield tile in a shape of a hexagonal prism.

Although depicted as a square prism, in other embodiments, shield tile 802 may be implemented using any suitable shape of prism. For example, in some embodiments, shield tile 802 may be implemented as an hexagonal prism. Prism 1502, as depicted in FIG. 15B, is an example of a hexagonal prism.

Figure 9A:
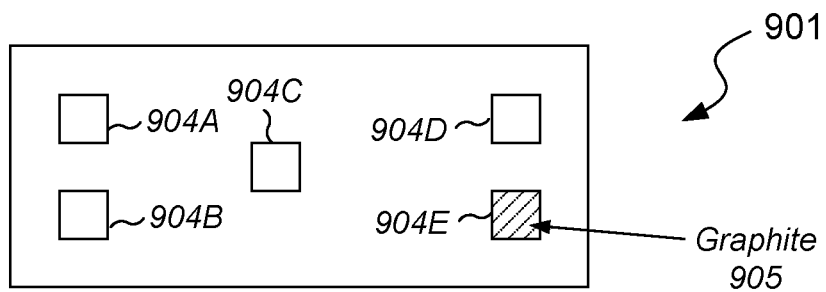
FIG. 9A is diagram depicting an embodiment of a conductive layer included in a shield tile.

Turning to FIG. 9A, a block diagram of an embodiment of a conductive layer in a shield tile is depicted. In various embodiments, conductive layer 810 may correspond to conductive layer 803 as depicted in the embodiment of FIG. 8B.

In various embodiments, conductive layer 901 may be a layer of metal, e.g., silver or gold, or graphite paste that is sandwiched between gemstones 808 and 809. In some cases, the layer of metal may be deposited on gemstone 809. Alternatively, the layer of metal may be fabricated separately from gemstones 808 and 809 and placed between gemstones 808 and 809 when shield tile 802 is assembled. In some cases, one or more voids may be left in the metal layer to promote adhesion between gemstones 808 and 809. The voids may, in some embodiments, be etched in conductive layer 901 once the metal has been deposited on gemstone 809.

As illustrated, conductive layer 901 includes voids 904A-904E. Although depicted as being squares, in other embodiments, voids 904A-904E may be any suitable shape. Moreover, although five voids are depicted in the embodiment of FIG. 9A, in other embodiments, any suitable number of voids may be employed. In some cases, a number of voids included in conductive layer 901 may be based on an amount of surface area used to attached layer 801 to layer 802.

In some cases, graphite may be formed in one of voids 904A-904E after gemstone 808 is formed and/or attached to gemstone 809. For example, graphite 905 is formed in void 904E using a laser or other suitable device. By filling in one or more of voids 904A-904E in such a fashion, a complete electromagnetic interference shield may be maintained despite the voids used for attaching gemstone 808 to gemstone 809.

Figure 9B:
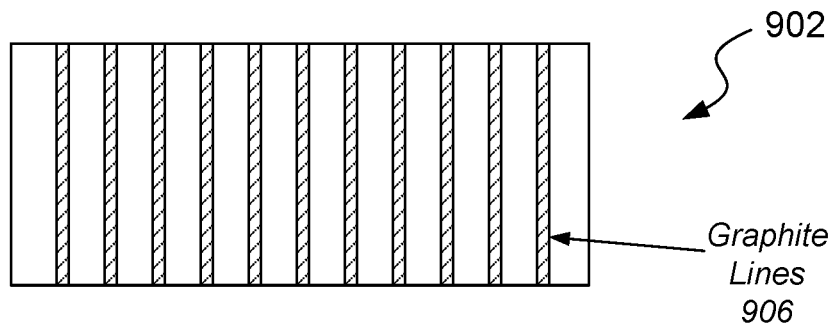
FIG. 9B is a diagram depicting an embodiment of a converted region included in a shield tile.

Turning to FIG. 9B, an embodiment of a converted region in a shield tile is depicted. In various embodiments, converted 902 may correspond to converted region 804 as depicted in the embodiment of FIG. 8A.

As illustrated, converted region 902 includes multiple graphite lines 906. In various embodiments, graphite lines 906 may be formed within diamond 803 using a laser or other suitable device.

In some embodiments, a spacing between graphite lines 906 may be based, at least in part, on a frequency of electromagnetic radiation to be blocked. To block higher frequency radiation, the spacing between graphite lines 906 may be decreased. It is noted that a number of graphite lines 906 included in converted region 902 may be based, in part, on a spacing between graphite lines 906.

Although graphite lines 906 are depicted as running parallel to a short axis of converted region 902, in other embodiments, graphite lines 906 may be oriented in any suitable direction. It is noted that, in some embodiments, each of graphite lines 906 may be coupled together and electrically coupled to a ground supply node.

Figure 9C:
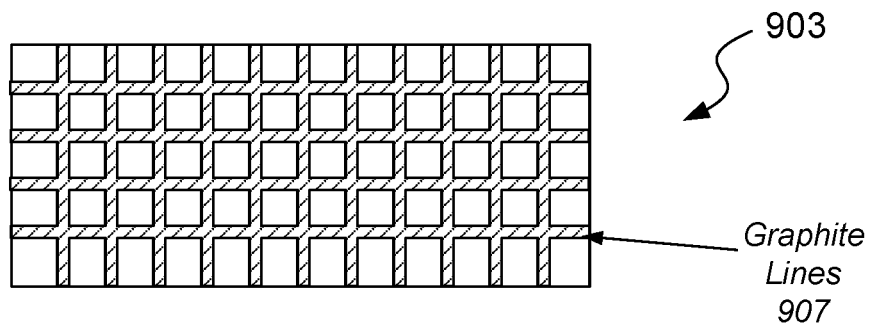
FIG. 9C is a diagram depicting a different embodiment of a converted region included in a shield tile.

Turning to FIG. 9C, a different embodiment of a converted region in a shield tile is depicted. In various embodiments, converted region 903 may correspond to converted region 804 as depicted in the embodiment of FIG. 8A.

As illustrated, converted region 903 includes a grid of graphite lines 907. In various embodiments, graphite lines 907 may be formed inside of diamond 803 using a laser or other suitable device.

In some embodiments, a spacing between graphite lines 907 may be based, at least in part, on a frequency of electromagnetic radiation to be blocked. To block higher frequency radiation, the spacing between graphite lines 907 may be decreased. It is noted that a number of graphite lines 907 included in converted region 903 may be based, in part, on a spacing between graphite lines 907.

Although graphite lines 907 are depicted as running parallel to the sides of converted region 903, in other embodiments, the orientation of graphite lines 907 may be in any suitable direction. Moreover, although graphite lines 907 are depicted as intersecting at right angles, in other embodiments, individual ones of graphite lines 907 may intersect at any suitable angle.

Figure 10A:
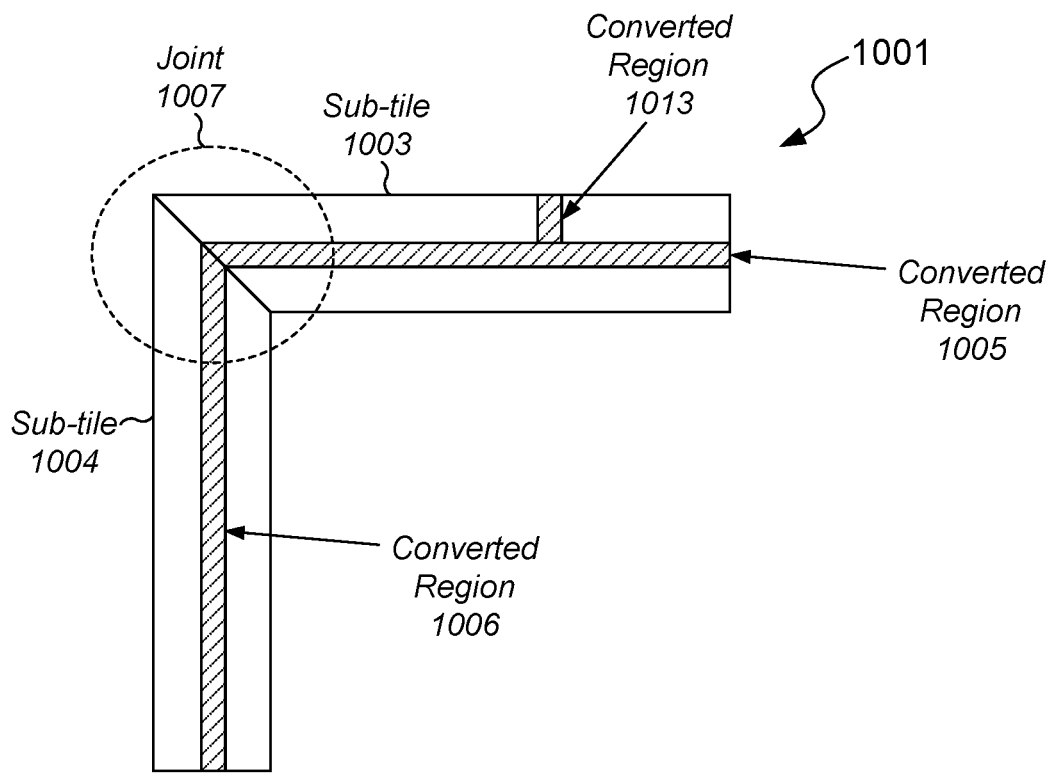
FIG. 10A is a diagram depicting an embodiment of a technique for coupling two shield tiles together using beveled edges.

In order to provide a larger EMI shield or to create an EMI enclosure, multiple shield tiles may be coupled together. To facilitate such coupling, edges of a shield tile may be beveled to more easily mate with edges from other shield tiles. A block diagram of an embodiment of shield tile sub-assembly is depicted in FIG. 10A. As illustrated, shield tile sub-assembly 1001 includes sub-tile 1003 and sub-tile 1004. In various embodiments, sub-tiles 1003 and 1004 may correspond to shield tile 801 as depicted in FIG. 8A.

Sub-tile 1003 includes converted region 1005, while sub-tile 1004 includes converted region 1006. In various embodiments, converted regions 1005 and 1006 may be coupled to a ground supply node. As illustrated, sub-tile 1003 also includes converted region 1013. In various embodiments, converted region is orthogonal to converted region 1005 and is between converted region 1005 and a base of sub-tile 1003. In some cases, converted region 1013 may be coupled to a ground supply node to provide another point of electrical contact between the ground supply node and converted regions 1005 and 1006.

Sub-tile 1003 and sub-tile 1004 are both beveled so the two sub-tiles may be coupled together to form joint 1007. It is noted that although sub-tile 1003 and sub-tile 1004 are depicted as being beveled at a 45-degree angle, in other embodiments, any suitable angle may be used. Using multiple bevel angles may, in some embodiments, allow for the creation of shield enclosures of any desired shape.

In addition to using bevels faces to join two sub-tiles together, other "wood joinery" techniques may be employed. For example, two sub-tiles may be joined using techniques such as, but not limited to, mitered butt, basic butt, tongue and groove, half lap, mortise and tenon, rabbet joint, biscuit joint, half-blind dovetail, cross-lap, and the like.

The bevels in sub-tile 1003 and sub-tile 1004 may be cut using a laser, abraded with diamond-grit sandpaper or belts, or any other suitable technique. The gemstone portions of sub-tile 1003 and sub-tile 1004 may be joined using an adhesive or any other suitable technique for coupling one gemstone to another. Alternatively, or additionally, sub-tile 1003 and sub-tile 1004 may be joined without any sort of adhesive, but through the use of pressure externally applied by a framework or other suitable structure. Once sub-tile 1003 and sub-tile 1004 are joined, conductive layer 1005 is electrically connected to conductive layer 1006 in joint 1007.

Although only a single joint between two sub-tiles is depicted in the embodiment of FIG. 10A, in other embodiments, more sub-tiles with corresponding joints may be employed. Moreover, each edge of a sub-tile may be coupled to other sub-tiles.

Figure 10B:
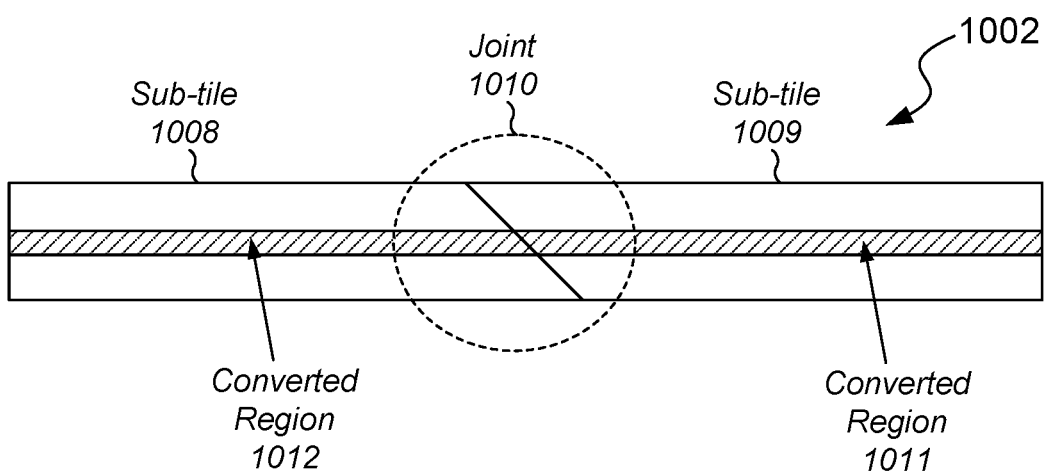
FIG. 10B is a diagram depicting a different embodiment of a technique for coupling two shield tiles together using beveled edges.

Beveled edges may also be used to couple sub-tiles together to form a larger planar shield-tile sub-assembly. A block diagram of an embodiment of such a shield-tile sub-assembly is depicted in FIG. 10B. As illustrated, shield-tile sub-assembly 1002 includes sub-tile 1008 and sub-tile 1009. In various embodiments, sub-tiles 1008 and 1009 may correspond to either shield tile 801 or shield tile 802 as depicted in FIGS. 8A and 8B, respectively.

Sub-tile 1008 and sub-tile 1009 are both beveled so the two sub-tiles may be coupled together to form joint 1010. It is noted that although sub-tile 1008 and sub-tile 1009 are depicted as being beveled at a 45-degree angle, in other embodiments, any suitable angle may be used.

The bevels in sub-tile 1008 and sub-tile 1009 may be generated using a laser or other suitable cutting implement. The gemstone portions of sub-tile 1008 and sub-tile 1009 may be joined using an adhesive or any other suitable technique for coupling one gemstone to another. Once sub-tile 1008 and sub-tile 1009 are joined, converted region 1011 is electrically connected to converted region 1012 in joint 1010.

Although only a single joint between two sub-tiles is depicted in the embodiment of FIG. 10B, in other embodiments, more sub-tiles with corresponding joints may be employed. Moreover, each edge of a sub-tile may be coupled to other sub-tiles to form larger sub-assemblies. It is further noted that, in some embodiments, bevels may be omitted and two sub-tiles may be abutted together.

In some cases, electromagnetic interference originates within a circuit and not from an external source. For example, in some computer systems, multiple integrated circuits may be stacked one upon another to create a three-dimensional structure. Due to the proximity of the integrated circuits, electromagnetic radiation from one integrated circuit may couple into other integrated circuits. Such coupling can induce unwanted currents in metal lines or other conductors within a vertically integrated circuit that can affect the operation and performance of the vertically integrated circuit. For example, a high-frequency clock signal from an aggressor integrated circuit can couple into a vertically integrated circuit resulting in setup/hold or other timing violations.

To remediate the effects of such electromagnetic interference, one or more shield tiles may be used to shield electromagnetic radiation generated by one circuit from affecting other circuits. As noted above, when the conductive layer in a shield tile is coupled to a ground supply node, electromagnetic radiation redistributes charges, e.g., electrons, within the conductive layer preventing the field from progressing beyond the shield.

Figure 11:
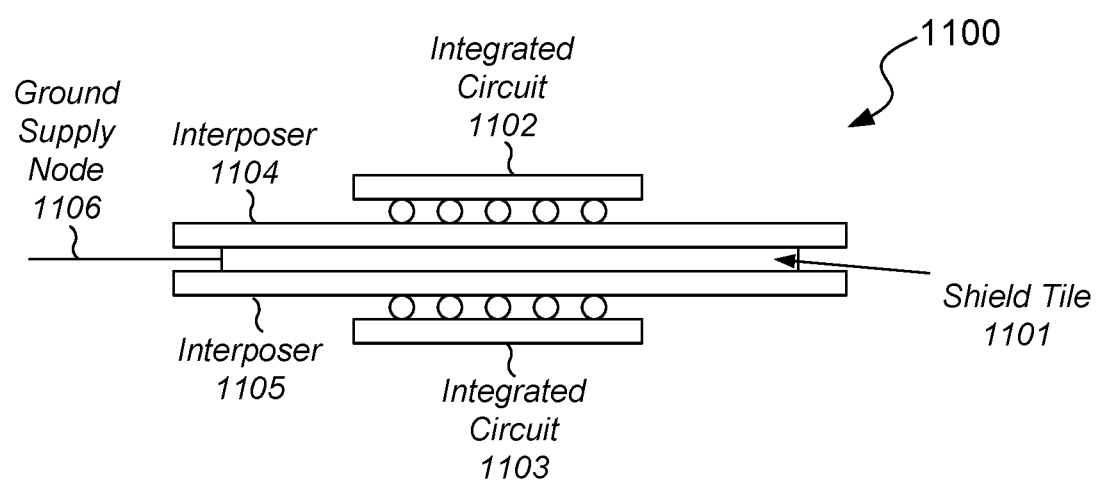
FIG. 11 is a block diagram depicting an embodiment of a structure for isolating two circuits from each other using a shield tile.

Turning to FIG. 11, a block diagram of a circuit assembly that includes a shield tile is depicted. As illustrated, circuit assembly 1100 includes shield tile 1101, integrated circuits 1102 and 1103, which are coupled to interposers 1104 and 1105, respectively. Although a single integrated circuit is depicted as being coupled to each of interposers 1104 and 1105, in other embodiments, any suitable number of integrated circuits may be coupled to interposers 1104 and 1105, which may include multiple metal lines, or traces, coupled between the different integrated circuits. It is noted that integrated circuits 1102 and 1103 may be either packaged or unpackaged chips.

Shield tile 1101 is coupled between interposer 1104 and 1105 and may, in various embodiments, correspond to shield tile 800 as depicted in FIG. 8. In various embodiments, a converted region or conductive layer included in shield tile 1101 (not shown) is coupled to ground supply node 1106, thereby providing a ground plane between integrated circuit 1102 and integrated circuit 1103, isolating the two integrated circuits from one another's electromagnetic radiation.

Although shield tile 1101 is depicted as being of similar size to interposers 1104 and 1105, in other embodiments, shield tiles may be of similar size to either a packaged or unpacked computer chip (also referred to as a "die"). In some cases, the shield tile may be directly affixed to an unpackaged integrated circuit, or attached to a package of an integrated circuit. It is noted that depending on the size of an integrated circuit, either packaged or unpackaged, multiple shield sub-tiles may be coupled together to form a desired shield tile area.

It is noted that the thermal properties of the gemstones included in shield tile 1101 allow heat to flow through shield tile 1101 as part of an overall thermal management strategy. In some cases, shield tile 1101 may be coupled to a heat sink, heat spreader, or any other suitable thermal management structure.

Although a stack of only two integrated circuits is depicted in the embodiment of FIG. 11, in other embodiments, any suitable number of integrated circuits may be stacked in such a fashion, with corresponding shield tiles between adjacent integrated circuits.

Figure 12:
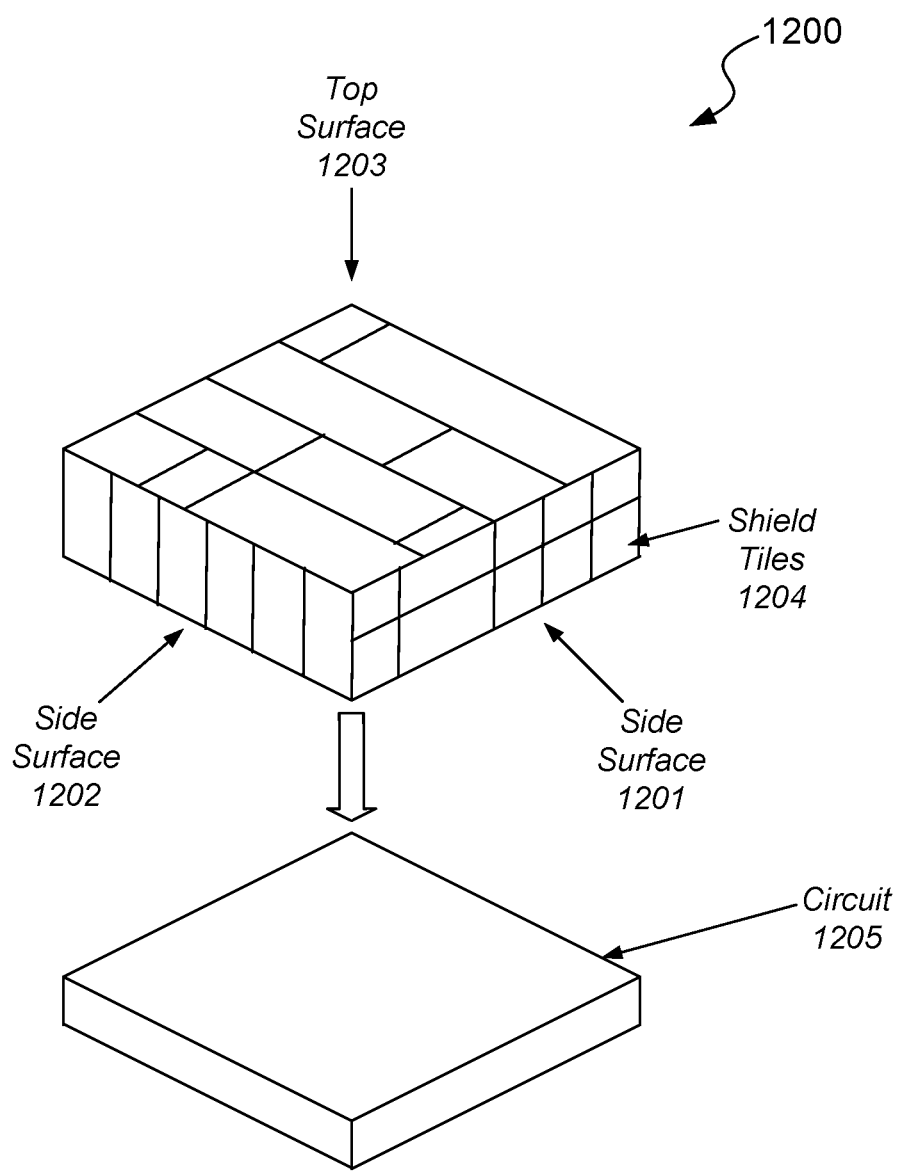
FIG. 12 is a block diagram of an embodiment of an electromagnetic interference shield implemented using multiple shield tiles.

Turning to FIG. 12, a block diagram of an embodiment of a shield enclosure is depicted. As illustrated, shield enclosure 1200 includes shield tiles 1204, any of which may correspond to shield tile 800 as depicted in FIG. 8, and is configured to encapsulate and shield circuit 1205 from electromagnetic interference. It is noted that shield enclosure 1200 is a three-dimensional structure and may or may not include a bottom surface.

Circuit 1205 may, in some embodiments, include any suitable combination of passive circuit elements, active circuits elements, integrated circuits, and the like. In some cases, circuit 1205 may include a stack of one or more integrated circuits as depicted in FIG. 11. It is noted that, in some embodiments, circuit 1205, including any sub-circuits or elements, may be encapsulated in a thermal conductive mold compound, a ceramic package, or any other suitable packaging material.

In various embodiments, shield tiles 1204 may include a variety of different sizes and shapes. Although shield tiles 1204 are depicted as being rectangular, in other embodiments, shield tiles 1204 may include other shapes, such as octagons. It is noted that the conductive layers of shield tiles 1204 are coupled to each other and to a ground supply node.

The number and shape of shield tiles 1204 may, in some embodiments, be determined based on a tiling pattern determined to best cover circuit 1205. In various embodiments, the tiling pattern may be a Penrose tiling pattern. In other embodiments, the determining tiling pattern may be either periodic, aperiodic, or any suitable combination thereof. For example, the tiling pattern on side surface 1202 is periodic using the same size tiles. In contrast, the tiling pattern on side surface 1201 is periodic using different size tiles, while the tiling pattern for top surface 1203 is aperiodic.

As described above, edges of different ones of shield tiles 1204 may be beveled to facilitate coupling one shield tile to another. In various embodiments, which edges of which of shield tiles 1204 are beveled may be based, at least in part, on the determined tiling pattern. In some case, an angle of the bevel for different edges of particular shield tiles of shield tiles 1204 may also be based on the determined tiling pattern. In some cases, shield tiles 1204 may be coupled to one another using any suitable adhesive. In other embodiments, shield tiles 1204 may be coupled to one another without the use of an adhesive. Instead, shield enclosure 1200 may be held together by pressure applied by an external framework, buttresses, insulating belts or bands, other shield enclosures, and the like.

Although shield enclosure 1200 is depicted as being a rectangular solid, in other embodiments, shield enclosure 1200 may be any suitable three-dimensional shape. In some embodiments, the shape of shield enclosure 1200 may be based on a shape of circuit 1205 and may not be limited to rectangular solids. For example, in some embodiments, shield enclosure 1200 may be a tetrahedron, dodecahedron, or any other suitable shape.

Figure 13:
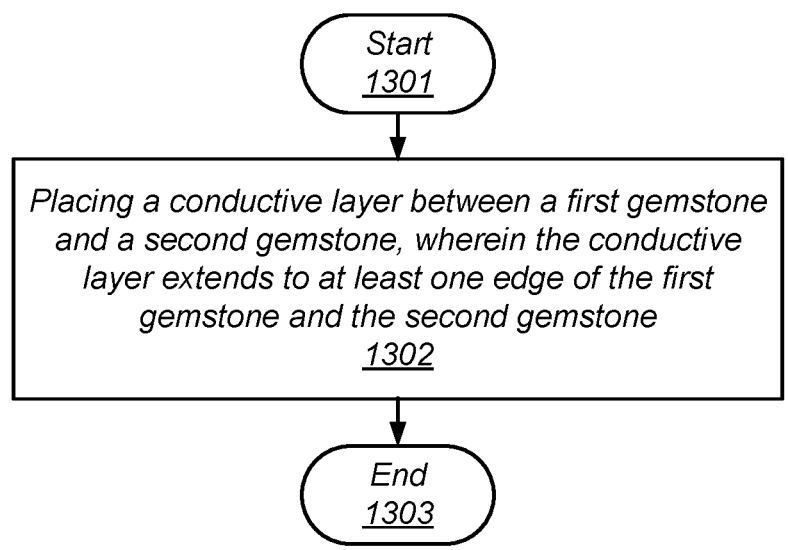
FIG. 13 is a flow diagram depicting an embodiment of a method for forming a shield tile.

Turning to FIG. 13, a flow diagram depicting an embodiment of a method for forming a shield tile is illustrated. The method, which may be used to form various shield tiles, e.g., shield tile 802 as depicted in FIG. 8B, begins in block 1301. It is noted that the embodiment of the method depicted in the flow diagram of FIG. 13 may be used in conjunction with any of the other methods depicted in this disclosure.

The method includes forming a placing layer between a first gemstone and a second gemstone (block 1302). In various embodiments, the conductive layer extends to at least one edge of the first gemstone and the second gemstone. In other embodiments, a shape of the conductive layer may be the substantially the same as the shape of the first gemstone. In some embodiments, the first gemstone may include a diamond or any other suitable transparent gemstone. The first gemstone may be a naturally occurring gemstone, or may be a man-made gemstone. In various embodiments, the first and second gemstones, when coupled together, form a prism-shaped shield tile.

In some embodiments, the conductive layer includes graphite, and forming the conductive layer on the first layer includes generating the graphite on a surface of the first layer using a laser. As described above, such graphite may be generated as a pattern of parallel lines, a grid of intersecting lines, or any other suitable arrangement of lines or other shapes. In other embodiments, the conductive layer includes at least one of gold and silver. In such cases, the conductive layer may be deposited on the surface of the first layer using any suitable deposition process. In some embodiments, the conductive layer may be placed in a void in at least one of the first gemstone and the second gemstone.

In some embodiments, the second gemstone may be a diamond or other suitable transparent gemstone, and may be substantially the same shape as the first gemstone and the conductive layer. In some cases, the second gemstone may be glued, using any suitable adhesive, to the conductive layer and the first gemstone. Alternatively, the first gemstone, the conductive layer, and the second gemstone may be held together using externally applied pressure or buttressing in lieu of an adhesive. In other cases, the second gemstone may be formed on top of the conductive layer as described above.

In cases where a metal, e.g., gold or silver, is deposited on the first layer, one or more voids may be left in the conductive layer. In some embodiments, such voids may assist in the second layer adhering to the first layer. The method may, in some embodiments, further include generating graphite in the at least one void subsequent to forming the second layer. In such cases, the graphite is electrically connected to the conductive layer. By filling the at least one void with graphite, the quality of electromagnetic shielding provided by the shield tile may be maintained by providing a continuous layer of conductive material.

In some embodiments, the method may include laser cutting or abrading, with a diamond-grit wheel, diamond-grit belt, diamond-grit paper, and the like, at least one edge of the shield tile at a predetermined angle to form a beveled edge or other joinery structure as described above. The predetermined angle may be 45-degrees, 60-degrees, or any other suitable angle. In some cases, the predetermined angle may be based on a bevel of a corresponding edge of a different shield tile that is included in a shield enclosure. The method concludes in block 1305.

Figure 14:
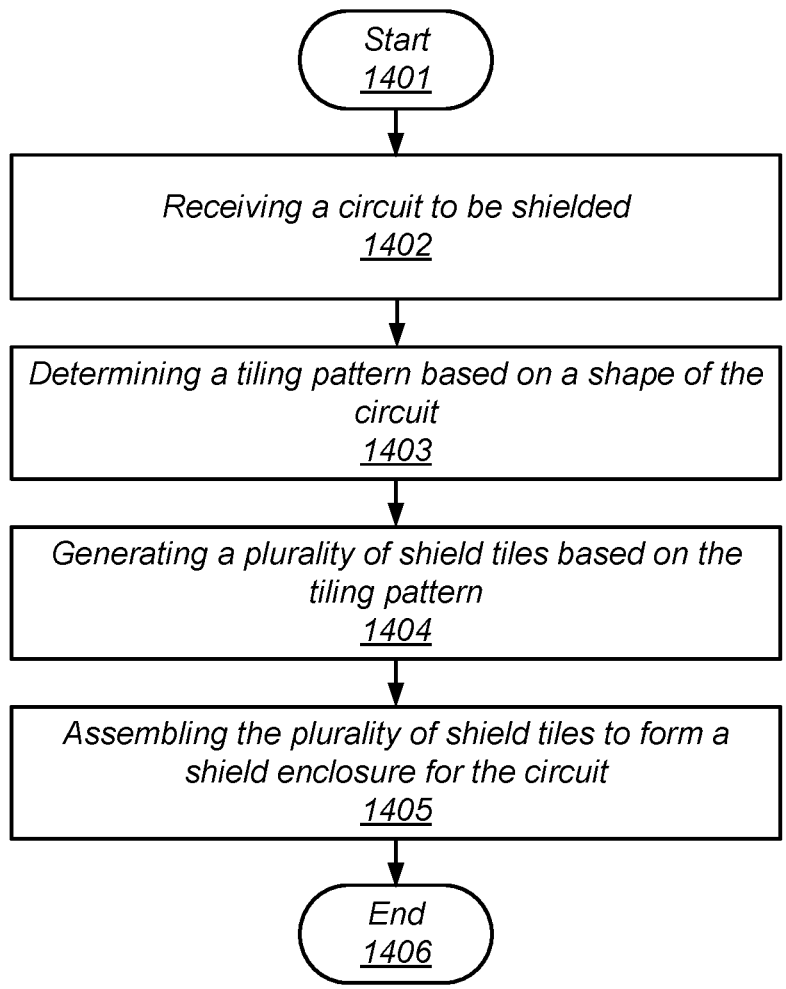
FIG. 14 is a flow diagram depicting an embodiment of a method for shielding a circuit using multiple shield tiles.

Turning to FIG. 14, a flow diagram depicting an embodiment of a method for assembling multiple shield tiles to form a shield enclosure for a circuit is depicted. The method, which may be applied to various shield enclosures, e.g., shield enclosure 1200 as depicted in FIG. 12, begins in block 1401.

The method includes receiving a circuit to be shielded (block 1402). In various embodiments, the circuit may include any suitable combination of passive circuit elements, active circuit elements, integrated circuits, and the like. In some cases, the circuit may include multiple integrated circuits stacked in a vertical fashion. In such cases, one or more shield tiles may be included between different ones of the integrated circuits included in the stack. In some embodiments, the circuit may be encased on a thermally conductive plastic or other suitable material to which shield tiles may be affixed.

The method also includes determining a tiling pattern based on a shape of the circuit (block 1403). In various embodiments, determining the tiling pattern may include determining a Penrose tiling pattern based on the shape of the circuit. In some cases, the tiling pattern may be either periodic or aperiodic that employs a set of tile shapes that cannot form a repeating pattern. In various embodiments, the tiling pattern includes a map that maps a particular tile to a corresponding location on the circuit.

The method further includes generating a plurality of shield tiles based on the tiling pattern (block 1404). In some embodiments, the plurality of shield tiles may have a similar structure to shield tile 800 as depicted in FIG. 8. Different sets of shield tiles with different numbers of sides may be employed based on the tiling pattern. For example, the plurality of shield tiles may include octagonal and rectangular tiles of various sizes.

The method also includes assembling the plurality of shield tiles to form a shield enclosure for the circuit (block 1405). Assembling the plurality of shield tiles may, in various embodiments, include affixing a given tile of the plurality of tiles to a corresponding location on the circuit. In some cases, the given tile may be affixed using a thermally conductive adhesive. The method concludes in block 1406.

Figure 16:
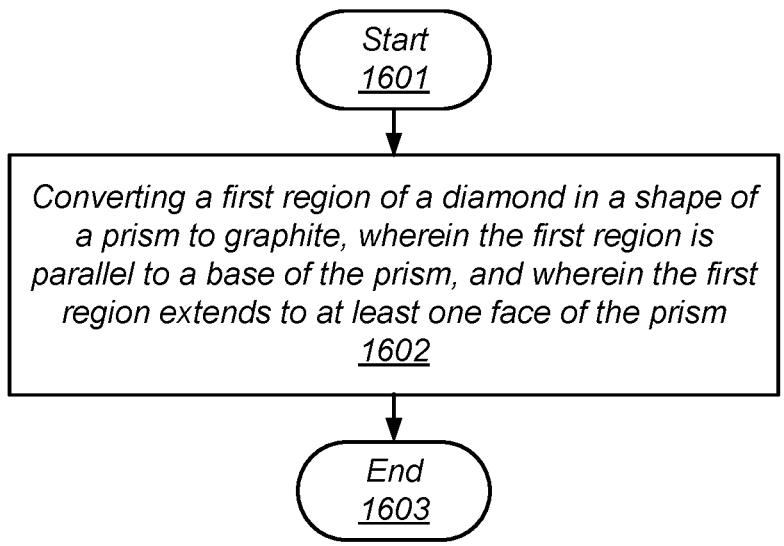
FIG. 16 is a flow diagram depicting an embodiment of a different method for forming a shield tile.

Turning to FIG. 16, a flow diagram depicting an embodiment of a different method for forming a shield tile is illustrated. The method, which may be used to form various shield tiles, e.g., shield tile 801 as depicted in FIG. 8A, begins in block 1601.

The method includes converting a first region of a diagram in the shape of a prism to graphite (block 1602). In various embodiments, the first region extents to at least one face of the prism.

In some embodiments, converting the first region to graphite includes converting the first region to one or more graphite lines. In other embodiments, converting the first region to graphite includes converting the first region into a grid of one or more graphite lines. In some embodiments, the first region extends to each face of the prism.

In various embodiments, the method may also include converting a second region of the diamond to graphite. In such cases, the second region may be located between the first region and a given base of the prism, and the second region may extent to the given base of the prism. The method concludes in block 1603.

Figure 17:
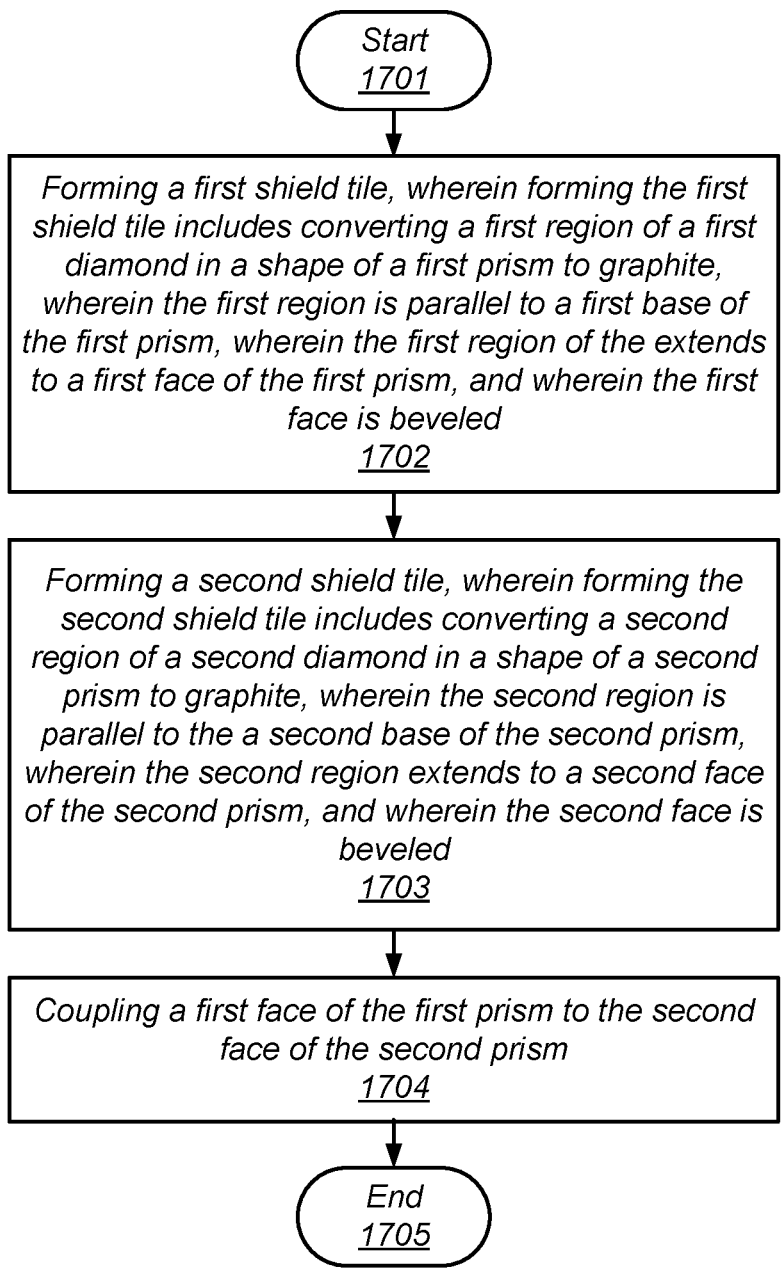
FIG. 17 is a flow diagram depicting an embodiment of a method for coupling two shield tiles together.

Turning to FIG. 17, a flow diagram depicting an embodiment of a method for coupling two shield tiles together is illustrated. The method, which may be applied to various shield tiles, e.g., shield tile 801 as depicted in FIG. 8A, begins in block 1701.

The method includes forming a first shield tile (block 1702). In various embodiments, forming the first shield tile includes converting a first region of a first diamond in a shape of a first prism to graphite. In some embodiments, the first region is parallel to a first base of the first prism, where the first region extends to a first face of the first prism, where the first face is beveled.

The method also includes forming a second shield tile (block 1703). In various embodiments, forming the second shield tile includes converting a second region of a second diamond in a shape of a second prism to graphite. In some embodiments, the second region is parallel to a second base of the second prism, wherein the second region extents to a second phase of the second prism, wherein the second face is beveled.

The method further includes coupling the first face of the first prism to the second face of the second prism (block 1704). Although the method depicted in FIG. 17 describes forming and coupling two shield tiles, in other embodiments, any suitable number of shield tiles may be formed and coupled together, The method concludes in block 1705.

The current disclosure is further defined in the following clauses:

Clause 1. A cultured diamond comprising:
A substrate portion;
At least one artificially embedded inclusion(s) disposed on the substrate portion; and
An encapsulating portion, formed on the at least one artificially embedded inclusion(s),
wherein the substrate portion and the encapsulating portion are bonded by covalent carbon to carbon bonds.

Clause 2. The cultured diamond of clause 1, wherein the substrate portion and the encapsulating portion are diamond.

Clause 3. The cultured diamond of clause 1, wherein the substrate portion and/or encapsulating portion are formed by chemical vapor deposition (CVD), hot filament chemical vapor deposition (HFCVD), microwave plasma chemical vapor deposition (MPCVD), or a high pressure high temperature process (HPHT).

Clause 4. The cultured diamond of clause 1, wherein the substrate portion, the encapsulating portion, and optionally the at least one artificially embedded inclusion(s) are formed by chemical vapor deposition (CVD).

Clause 5. The cultured diamond of clause 1, wherein the at least one artificially embedded inclusion(s) comprises human readable or machine readable indicia.

Clause 6. The cultured diamond of clause 5, wherein the human readable or machine readable indicia comprise, an authentication identifier, a QR code, a bar code, an alphanumeric marking, written text, a personalized inscription, an image, a decorative design, a symbol, a pattern, a logo, or a combination thereof.

Clause 7. The cultured diamond of clause 5, wherein the human readable or machine readable indicia comprise at least one material layer formed on the substrate portion.

Clause 8. The cultured diamond of clause 7, wherein the human readable or machine readable indicia is formed from:
deposition of the least one material layer on a planar surface of the substrate portion, or
deposition of the least one material layer on a non-planar surface of the substrate portion.

Clause 9. The cultured diamond of clause 7, wherein the material layer comprises graphite, graphene, a metal oxide compound, a metallic compound, or a combination thereof.

Clause 10. The cultured diamond of clause 5, wherein the human readable or machine readable indicia are formed through a process comprising laser ablation, wet etching, ion milling, ion beam irradiation, direct laser writing, microprinting, sputter deposition, maskless lithography, or a combination thereof.

Clause 11. The cultured diamond of clause 1, wherein the at least one artificially embedded inclusion(s) comprises a secondary gemstone.

Clause 12. The cultured diamond of clause 11, wherein the secondary gemstone comprises a gray diamond, white diamond, blue diamond, yellow diamond, orange diamond, red diamond, olive diamond, green diamond, pink diamond, violet diamond, brown diamond, black diamond, garnet, ruby, peridot, sapphire, diopside, emerald, amethyst, topaz, citrine or a combination thereof.

Clause 13. The cultured diamond of clause 11, wherein secondary gemstone is pretreated to increase nucleation sites and/or nucleation density.

Clause 14. The cultured diamond of claim 13, wherein the secondary gemstone is pretreated by coating with diamond nanoparticles, electrostatic seeding with diamond nanoparticles, polishing with diamond grit, mechanical surface abrasion, chemical nucleating solutions comprising adamantane powder, or combinations thereof.

Clause 15. The cultured diamond of clause 11, wherein the secondary gemstone is disposed within a formed cavity on the surface of the substrate portion.

Clause 16. The cultured diamond of clause 11, wherein the encapsulating portion is deposited onto the secondary gemstone and onto the substrate portion by a chemical vapor deposition (CVD), hot filament chemical vapor deposition (HFCVD), microwave plasma chemical vapor deposition (MPCVD).

Clause 17. The cultured diamond of clause 1, wherein the at least one artificially embedded inclusion(s) comprises a combination of a human readable or machine readable indicia and a secondary gemstone.

Clause 18. A cultured diamond, comprising:
a substrate portion comprising a diamond;
at least one artificially embedded inclusion(s) comprising one or more non-diamond carbon layer (s); and
an encapsulating portion comprising a diamond, formed onto the at least one artificially embedded inclusion(s) and the substrate portion,
wherein the substrate portion and the encapsulating portion are bonded through covalent carbon to carbon bonds.

Clause 19. The cultured diamond of clause 18, wherein the at least one non-diamond carbon layer(s) comprises a deposited graphite layer, deposited graphene layer, a deposited amorphous carbon layer, or a graphitized layer.

Clause 20. The cultured diamond of clause 18, wherein, the substrate portion is formed by chemical vapor deposition (CVD), hot filament chemical vapor deposition (HFCVD), microwave plasma chemical vapor deposition (MPCVD), or high pressure high temperature (HPHT) process; and
the encapsulating portion is grown onto the substrate portion subsequently, by chemical vapor deposition (CVD), hot filament chemical vapor deposition (HFCVD), microwave plasma chemical vapor deposition (MPCVD).

Clause 21. A method of embedding artificial inclusion(s) in a diamond, the method comprising:
forming a substrate portion comprising a diamond;
disposing at least one artificial inclusion(s) on the substrate portion; and
forming an encapsulating portion comprising a diamond, onto the at least one artificial inclusion(s) and substrate portion;
wherein the substrate portion and the encapsulating portion are formed by chemical vapor deposition (CVD), hot filament chemical vapor deposition (HFCVD), microwave plasma chemical vapor deposition (MPCVD), or high pressure high temperature (HPHT) process.

Clause 22. The method of clause 21, wherein the at least one artificial inclusion(s) comprises a secondary gemstone.

Clause 23. The method of clause 22, wherein the secondary gemstone comprises a gray diamond, white diamond, blue diamond, yellow diamond, orange diamond, red diamond, olive diamond, green diamond, pink diamond, violet diamond, brown diamond, black diamond, garnet, ruby, peridot, sapphire, diopside, emerald, amethyst, topaz, citrine, or a combination thereof.

Clause 24. The cultured diamond of clause 22, further comprising pretreating the secondary gemstone to increase nucleation sites and/or nucleation density.

Clause 25. The method of clause 24, further comprising pretreating the secondary gemstone by coating with diamond nanoparticles, electrostatic seeding with diamond nanoparticles, polishing with diamond grit, mechanical surface abrasion, chemical nucleating solutions comprising adamantane powder, or combinations thereof.

Clause 26. The method of clause 21, further comprising:
forming at least one cavity on the surface of the substrate portion; and
disposing the secondary gemstone within the formed at least one cavity on the surface of the substrate portion.

Clause 27. The method of clause 21, further comprising disposing the secondary gemstone on a planar surface of the substrate portion.

Clause 28. The method of clause 21, further comprising pretreating the surface of the substrate portion, prior to forming the encapsulating portion and/or prior to disposing the at least one artificial inclusion(s) thereon.

Clause 29. The method of clause 28, wherein pretreating the surface of the substrate portion comprises removal of non-diamond carbon or amorphous carbon species, enhancement of nucleation sites or nucleation density, or a combination thereof.

Clause 30. The method of clause 29, wherein enhancement of nucleation sites or nucleation density comprises coating with chemical nucleation agents, electrostatic seeding with diamond nanoparticles, polishing with diamond grit, or a combination thereof.

Clause 31. An apparatus, comprising: a shield tile including a diamond in a shape of a prism, wherein the diamond includes a first region converted to graphite, wherein the first region is parallel to a base of the prism, and wherein the first region extends to at least one face of the prism.

Clause 32. The apparatus of clause 31, wherein the first region includes one or more graphite lines.

Clause 33. The apparatus of clause 31, wherein the first region includes a grid formed from one or more graphite lines.

Clause 34. The apparatus of clause 31, wherein the first region extends to each face of the prism.

Clause 35. The apparatus of clause 31, wherein the diamond includes a second region converted to graphite, wherein the second region is disposed between the first region and a given base of the prism, and wherein the second region extends to the given base of the prism.

Clause 36. An apparatus, comprising: a first shield tile including a first diamond in a shape of a first prism, wherein the first diamond includes a first region converted to graphite, wherein the first region is parallel to a base of the first prism, and wherein the first region extends to a first face of the first prism, the first face being beveled; and a second shield tile including a second diamond in a shape of a second prism, wherein the second diamond includes a second region converted to graphite, wherein the second region is parallel to a second base of the second prism, and wherein the second region extends to a second face of the second prism, wherein the second face of the second prism is beveled, and wherein the first face of the first prism is coupled to the second face of the second prism.

Clause 37. A method for forming a shield tile, comprising: placing a conductive layer between a first gemstone and a second gemstone, wherein the conductive layer extends to at least one edge of one of the first gemstone or the second gemstone.

Clause 38. The method of clause 37, wherein the conductive layer includes graphite.

Clause 39. The method of clause 38, further comprising forming the conductive layer, and wherein forming the conductive layer includes generating the graphite on a surface of the first gemstone using a laser.

Clause 40. The method of clause 37, wherein the conductive layer includes at least one of gold or silver.

Clause 41. The method of clause 37, wherein the conductive layer is placed in a void in at least one of the first or second gemstones.

Clause 42. The method of clause 37, wherein the shield tile is in a shape of a prism, and further comprising, cutting at least one face of a plurality of faces of the prism at a predetermined angle to form a beveled face.

Clause 43. An apparatus, comprising: a first circuit; a second circuit; and a shield tile disposed between the first circuit and the second circuit, wherein the shield tile includes a diamond in a shape of a prism, wherein the diamond includes a first region converted to graphite, wherein the first region is parallel to a base of the prism, wherein the first region extends to a least one face of the prism, and wherein the graphite is configured to be coupled to a ground supply node.

Clause 44. The apparatus of clause 43, wherein the first circuit includes one or more first integrated circuits, and wherein the second circuit includes one or more second integrated circuits coupled to a second substrate.

Clause 45. An apparatus, comprising: a circuit; and an enclosure surrounding the circuit, the enclosure comprising at least one shield tile including a diamond in a shape of a prism, wherein the diamond includes a first region converted to graphite, wherein the first region is parallel to a base of the prism, and wherein the first region extends to at least one face of the prism, and wherein the first region is configured to be coupled to a ground supply node.

Clause 46. The apparatus of clause 45, wherein the enclosure comprises a plurality of shield tiles that includes corresponding regions converted to graphite, wherein corresponding regions of adjacent shield tiles of the plurality of shield tiles are electrically coupled together and configured to be coupled to the ground supply node.

Clause 47. The apparatus of clause 46, wherein a first shield tile of the plurality of shield tiles includes a first face that is beveled, wherein a second shield tile of the plurality of shield tiles includes a second face that is beveled, wherein the first face of the first shield tile is coupled to the second face of the second shield tile.

Clause 48. The apparatus of clause 45, wherein the first region includes a plurality of graphite lines.

Clause 49. The apparatus of clause 45, wherein the first region includes a grid formed from a plurality of graphite lines.

Clause 50. The apparatus of clause 45, wherein the diamond includes a second region converted to graphite, wherein the second region is disposed between the first region and a given base of the prism, and wherein the second region extends to the given base of the prism.

Clause 51. A method for forming a shield tile, the method comprising: converting a first region of a diamond in a shape of a prism to graphite, wherein the first region is parallel to a base of the prism, and wherein the first region extends to at least one face of the prism.

Clause 52. The method of clause 51, further comprising converting the first region to one or more graphite lines.

Clause 53. The method of clause 51, further comprising converting the first region to a grid formed from one or more graphite lines.

Clause 54. The method of clause 51, wherein the first region extends to each face of the prism.

Clause 55. The method of clause 51, further comprising: converting a second region of the diamond to graphite, wherein the second region is located between the first region and a given base of the prism, and wherein the second region extends to the given base of the prism.

Clause 56. A method, comprising: forming a first shield tile, wherein forming the first shield tile comprises: converting a first region of a first diamond in a shape of a first prism to graphite, the first region being parallel to a first base of the first prism, and wherein the first region extends to a first face of the first prism, the first face being beveled; forming a second shield tile, wherein forming the second shield tile comprises: converting a second region of a second diamond in a shape of a second prism to graphite, the second region being parallel to a second base of the second prism, and wherein the second region extends to a second face of the second prism, wherein the second face of the second prism is beveled; and coupling the first face of the first prism to the second face of the second prism.

While exemplary embodiments are described above, it is not intended that these embodiments describe all possible forms encompassed by the claims. The words used in the specification are words of description rather than limitation, and it is understood that various changes can be made without departing from the spirit and scope of the disclosure. As previously described, the features of various embodiments can be combined to form further embodiments of the invention that may not be explicitly described or illustrated. While various embodiments could have been described as providing advantages or being preferred over other embodiments or prior art implementations with respect to one or more desired characteristics, those of ordinary skill in the art recognize that one or more features or characteristics can be compromised to achieve desired overall system attributes, which depend on the specific application and implementation. These attributes can include, but are not limited to cost, strength, durability, life cycle cost, marketability, appearance, packaging, size, serviceability, weight, manufacturability, ease of assembly, etc. As such, to the extent any embodiments are described as less desirable than other embodiments or prior art implementations with respect to one or more characteristics, these embodiments are not outside the scope of the disclosure and can be desirable for particular applications.

What is claimed is:

1. An apparatus, comprising:
a shield tile including a diamond gemstone in a shape of a prism, wherein the diamond gemstone includes a first region converted to graphite, wherein the first region is parallel to a base of the prism, and wherein the first region extends to at least one face of the prism.

2. The apparatus of claim 1, wherein the first region includes one or more graphite lines.

3. The apparatus of claim 1, wherein the first region includes a grid formed from one or more graphite lines.

4. The apparatus of claim 1, wherein the first region extends to each face of the prism.

5. The apparatus of claim 1, wherein the diamond gemstone includes a second region converted to graphite, wherein the second region is disposed between the first region and a given base of the prism, and wherein the second region extends to the given base of the prism.

6. An apparatus, comprising:
a circuit; and
an enclosure surrounding the circuit, the enclosure comprising at least one shield tile including a diamond gemstone in a shape of a prism, wherein the diamond gemstone includes a first region converted to graphite, wherein the first region is parallel to a base of the prism, and wherein the first region extends to at least one face of the prism, and wherein the first region is configured to be coupled to a ground supply node.

7. The apparatus of claim 6, wherein the enclosure comprises a plurality of shield tiles that includes corresponding regions converted to graphite, wherein corresponding regions of adjacent shield tiles of the plurality of shield tiles are electrically coupled together and configured to be coupled to the ground supply node.

8. The apparatus of claim 7, wherein a first shield tile of the plurality of shield tiles includes a first face that is beveled, wherein a second shield tile of the plurality of shield tiles includes a second face that is beveled, wherein the first face of the first shield tile is coupled to the second face of the second shield tile.

9. The apparatus of claim 6, wherein the first region includes a plurality of graphite lines.

10. The apparatus of claim 6, wherein the first region includes a grid formed from a plurality of graphite lines.

11. The apparatus of claim 6, wherein the diamond gemstone includes a second region converted to graphite, wherein the second region is disposed between the first region and a given base of the prism, and wherein the second region extends to the given base of the prism.

\* \* \* \* \*